(12) United States Patent
Chiu et al.

(10) Patent No.: US 12,051,634 B2
(45) Date of Patent: Jul. 30, 2024

(54) PACKAGE AND PACKAGE-ON-PACKAGE STRUCTURE HAVING ELLIPTICAL COLUMNS AND ELLIPSOID JOINT TERMINALS

(71) Applicant: Taiwan Semiconductor Manufacturing Company, Ltd., Hsinchu (TW)

(72) Inventors: Sheng-Huan Chiu, Taichung (TW); Chun-Jen Chen, Hsinchu County (TW); Chen-Shien Chen, Hsinchu County (TW); Kuo-Chio Liu, Hsinchu (TW); Kuo-Hui Chang, Taoyuan (TW); Chung-Yi Lin, Hsinchu (TW); Hsi-Kuei Cheng, Hsinchu County (TW); Yi-Jen Lai, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/356,243

(22) Filed: Jul. 21, 2023

(65) Prior Publication Data

US 2023/0369152 A1 Nov. 16, 2023

Related U.S. Application Data

(63) Continuation of application No. 17/834,938, filed on Jun. 8, 2022, now Pat. No. 11,756,849, which is a (Continued)

(51) Int. Cl.
*H01L 23/31* (2006.01)
*H01L 21/56* (2006.01)
(Continued)

(52) U.S. Cl.
CPC ........ *H01L 23/3121* (2013.01); *H01L 21/565* (2013.01); *H01L 23/3171* (2013.01);
(Continued)

(58) Field of Classification Search
CPC ............. H01L 23/3121; H01L 23/3171; H01L 23/3128; H01L 23/3114; H01L 23/535;
(Continued)

(56) References Cited

U.S. PATENT DOCUMENTS 7,863,735 B1 * 1/2011 Cho ........................ H01L 25/16
257/723
9,490,192 B1 * 11/2016 Chen .................. H01L 23/5389
(Continued)

*Primary Examiner* — Ida M Soward
(74) *Attorney, Agent, or Firm* — JCIPRNET

(57) ABSTRACT

A package includes a die, first conductive structures, second conductive structures, and an encapsulant. The die has a rear surface. The first conductive structures and the second conductive structures surround the die. The first conductive structures include cylindrical columns and the second conductive structures include elliptical columns. At least one of the second conductive structures is closer to the die than the first conductive structures. The encapsulant encapsulates the die, the first conductive structures, and the second conductive structures.

20 Claims, 18 Drawing Sheets

Related U.S. Application Data continuation of application No. 16/799,780, filed on Feb. 24, 2020, now Pat. No. 11,404,341, which is a continuation of application No. 15/925,790, filed on Mar. 20, 2018, now Pat. No. 10,573,573.

(51) Int. Cl.
  *H01L 23/00* (2006.01)
  *H01L 25/065* (2023.01)
  *H01L 25/07* (2006.01)
  *H01L 25/075* (2006.01)
  *H01L 25/11* (2006.01)

(52) U.S. Cl.
  CPC .............. *H01L 24/03* (2013.01); *H01L 24/09* (2013.01); *H01L 24/23* (2013.01); *H01L 24/25* (2013.01); *H01L 25/0657* (2013.01); *H01L 25/074* (2013.01); *H01L 25/0756* (2013.01); *H01L 25/117* (2013.01); *H01L 2224/02379* (2013.01); *H01L 2224/2105* (2013.01); *H01L 2224/2205* (2013.01); *H01L 2224/23* (2013.01); *H01L 2224/2401* (2013.01); *H01L 2224/2405* (2013.01); *H01L 2224/2505* (2013.01); *H01L 2225/1011* (2013.01); *H01L 2225/1047* (2013.01); *H01L 2225/1058* (2013.01); *H01L 2924/1811* (2013.01)

(58) Field of Classification Search
  CPC ......... H01L 24/09; H01L 24/23; H01L 24/25; H01L 25/0657; H01L 25/074; H01L 25/0756; H01L 25/117; H01L 25/105; H01L 2224/02379; H01L 2224/2105; H01L 2224/2205; H01L 2224/23; H01L 2224/2401; H01L 2224/2405; H01L 2224/2505; H01L 2224/04105; H01L 2224/12105; H01L 2224/32145; H01L 2224/32225; H01L 2224/48091; H01L 2224/48227; H01L 2224/73265; H01L 2224/73267; H01L 2224/92244; H01L 2225/1011; H01L 2225/1047; H01L 2225/1058; H01L 2225/0651; H01L 2225/05568; H01L 2225/1035; H01L 2924/1811; H01L 2924/15311
  See application file for complete search history.

(56) References Cited

U.S. PATENT DOCUMENTS

| | | | |
|---|---|---|---|
| 10,515,936 B1* | 12/2019 | Chang Chien | H01L 24/19 |
| 2012/0020026 A1* | 1/2012 | Oganesian | H01L 25/105 361/728 |
| 2012/0025365 A1* | 2/2012 | Haba | H01L 24/05 977/773 |
| 2014/0048906 A1* | 2/2014 | Shim | H01L 21/561 257/532 |
| 2014/0374902 A1* | 12/2014 | Lee | H01L 23/5389 257/738 |
| 2015/0200185 A1* | 7/2015 | Yu | H01L 23/49838 257/737 |
| 2015/0364404 A1* | 12/2015 | Chen | H01L 23/31 257/759 |
| 2016/0013144 A1* | 1/2016 | Chen | H01L 23/49838 257/774 |
| 2016/0020195 A1* | 1/2016 | Chiang | H01L 25/50 438/109 |
| 2017/0084579 A1* | 3/2017 | Shin | H01L 23/4985 |
| 2017/0207204 A1* | 7/2017 | Lin | H01L 25/105 |
| 2017/0278830 A1* | 9/2017 | Kim | H01L 25/105 |
| 2019/0088621 A1* | 3/2019 | Yang | H01L 23/5385 |

* cited by examiner

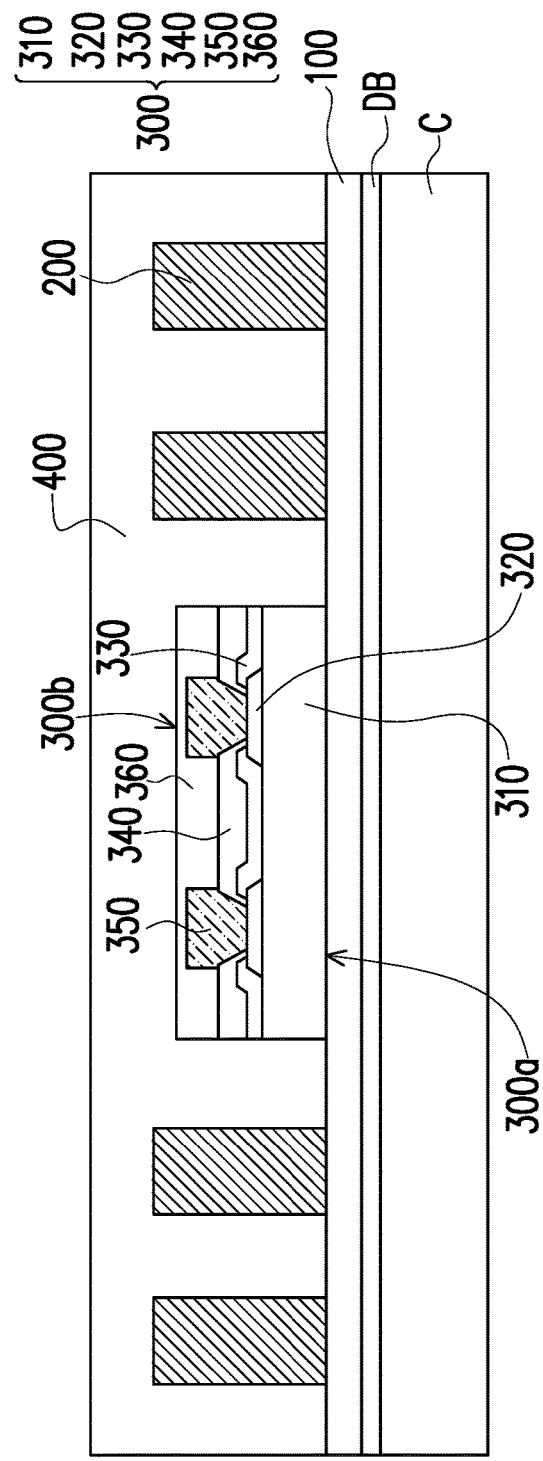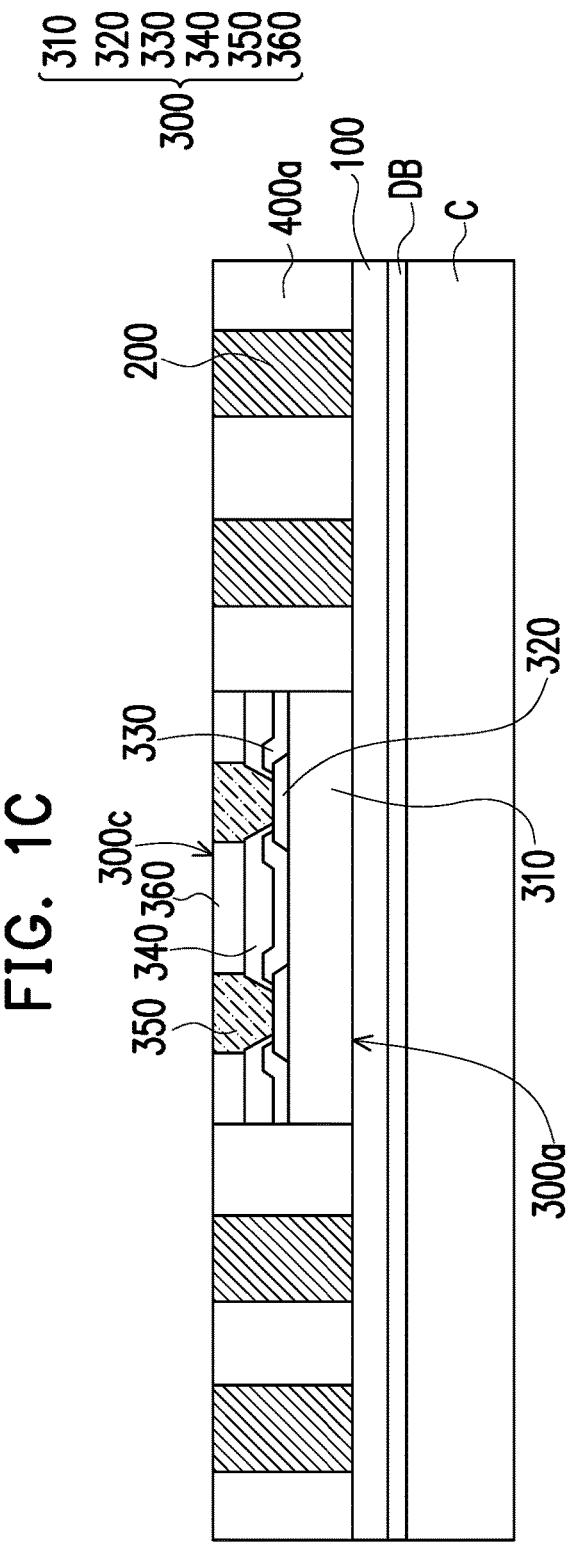

PACKAGE AND PACKAGE-ON-PACKAGE STRUCTURE HAVING ELLIPTICAL COLUMNS AND ELLIPSOID JOINT TERMINALS

CROSS-REFERENCE TO RELATED APPLICATION

This is a continuation application of and claims the priority benefit of U.S. application Ser. No. 17/834,938, filed on Jun. 8, 2022, now allowed. The prior application Ser. No. 17/834,938 is a continuation application of and claims the priority benefit of U.S. application Ser. No. 16/799,780, filed on Feb. 24, 2020, now patented. The prior application Ser. No. 16/799,780 is a continuation application of and claims the priority benefit of U.S. application Ser. No. 15/925,790, filed on Mar. 20, 2018, now patented. The entirety of each of the above-mentioned patent applications is hereby incorporated by reference herein and made a part of this specification.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. How to ensure the reliability of the integrated fan-out packages has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1L are schematic cross-sectional views illustrating a manufacturing process of a package and a package-on-package (PoP) structure in accordance with some embodiments of the disclosure.

DETAILED DESCRIPTION

Figure 1A:
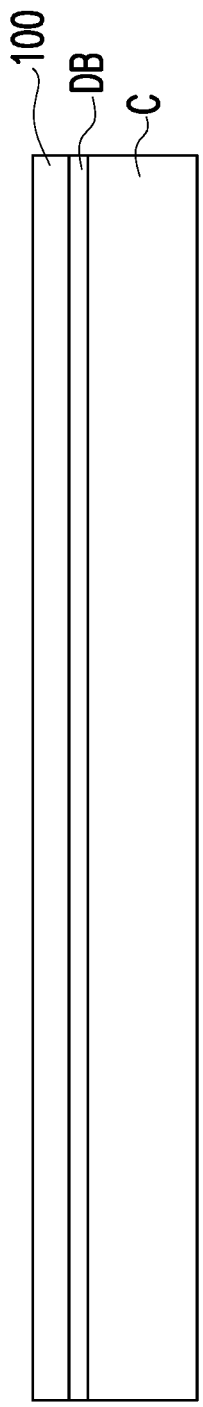

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic cross-sectional views illustrating a manufacturing process of a package 10 and a package-on-package (PoP) structure 1000 in accordance with some embodiments of the disclosure. Referring to FIG. 1A, a carrier C having a de-bonding layer DB and a dielectric layer 100 stacked thereon is provided. In some embodiments, the de-bonding layer DB is formed on the upper surface of the carrier C, and the de-bonding layer DB is between the carrier C and the dielectric layer 100. For example, the carrier C may be a glass substrate and the de-bonding layer DB may be a light-to-heat conversion (LTHC) release layer formed on the glass substrate. However, the disclosure is not limited thereto, and other suitable materials may be adapted for the carrier C and the de-bonding layer DB. In some embodiments, a material of the dielectric layer 100 includes polyimide (PI), epoxy resin, acrylic resin, phenol resin, benzocyclobutene (BCB), polybenzooxazole (PBO), or any other suitable polymer-based dielectric material. The dielectric layer 100, for example, may be formed by suitable fabrication techniques such as spin-on coating, chemical vapor deposition (CVD), plasma-enhanced chemical vapor deposition (PECVD), or the like. In some embodiments, the dielectric layer 100 may have adhesion property to adhere the subsequently formed elements.

Figure 1B:
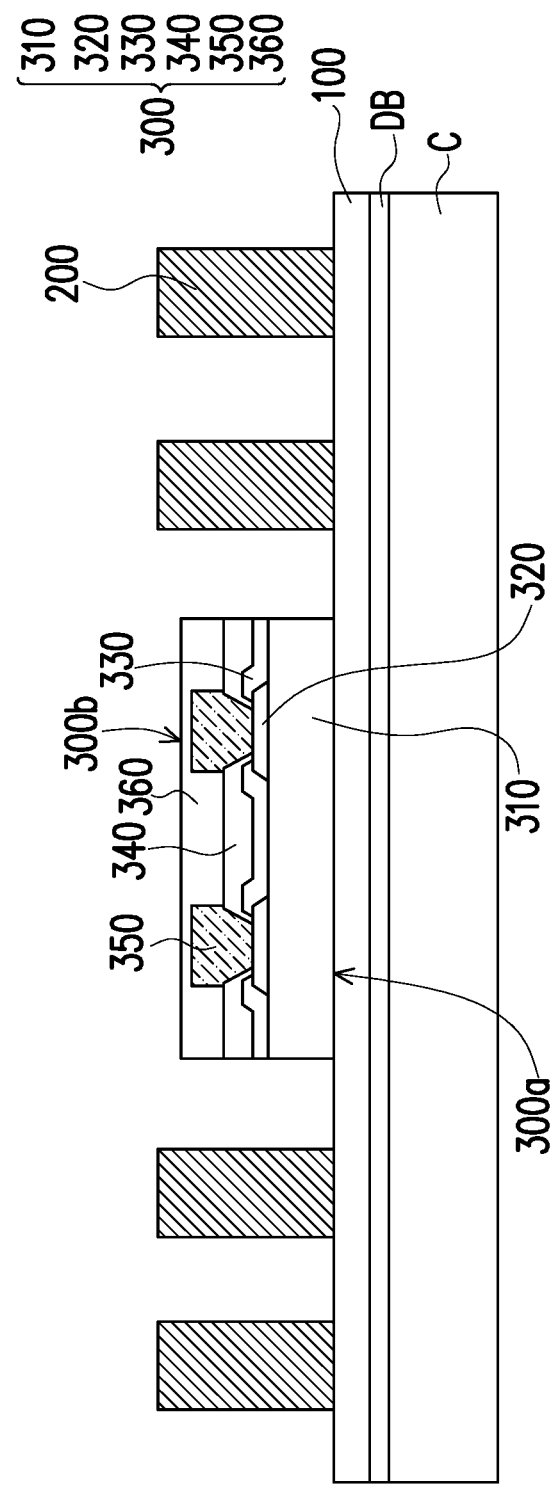

Referring to FIG. 1B, a plurality of conductive structures 200 and a die 300 are formed over the dielectric layer 100. In some embodiments, the die 300 is picked and placed onto the dielectric layer 100. The die 300, for example, includes a semiconductor substrate 310, a plurality of conductive pads 320, a passivation layer 330, a post passivation layer 340, a plurality of conductive vias 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors, or the like) formed therein. The conductive pads 320 may be aluminum pads, copper pads, or other suitable metal pads. The passivation layer 330 may be a silicon oxide layer, a silicon nitride layer, a silicon oxynitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed by the contact openings of the post passivation layer 340. The post-passivation layer 340 may be a PI layer, a PBO layer, or a dielectric layer formed by other suitable polymers. In addition, the conductive vias 350 are formed on the conductive pads 320. In some embodiments, the conductive vias 350 are plated on the conductive pads 320. The protection layer 360 is formed on the post-passivation layer 340 to cover the conductive vias 350.

As illustrated in FIG. 1B, the die 300 has a rear surface 300a and a front surface 300b opposite to the rear surface 300a. In some embodiments, the rear surface 300a of the die 300 is attached (or adhered) to the dielectric layer 100 through a die attach film (DAF; not shown). On the other hand, the front surface 300b of the die 300 faces upward and is exposed. Although one die 300 is illustrated in FIG. 1B, it construes no limitation in the disclosure. In some alternative embodiments, more than one dies 300 may be picked and placed onto the dielectric layer 100.

The conductive structures 200 are formed to surround the die 300. In some embodiments, the method of forming the conductive structures 200 includes the following steps. First, a seed material layer (not shown) is formed over the dielectric layer 100. In some embodiments, the seed material layer includes a titanium/copper composite layer formed by a sputtering process. Subsequently, a photoresist layer (not shown) with openings is formed on the seed material layer. The openings of the photoresist layer expose the intended locations for the subsequently formed conductive structures 200. Thereafter, a plating process is performed to form a metal material layer (e.g., a copper layer) on the seed material layer exposed by the openings of the photoresist layer. The photoresist layer and the underlying seed material layer are then removed to form the conductive structures 200. However, the disclosure is not limited thereto. In some alternative embodiments, the conductive structures 200 may be formed by pick and place pre-fabricated conductive structures onto the dielectric layer 100. In some embodiments, a height of the conductive structures 200 may be 100 µm to 200 µm.

In some embodiments, the geometry and the arrangement of the conductive structures 200 play significant roles in ensuring the reliability of the subsequently formed package 10. The configuration of the conductive structures 200 will be described in detail below in conjunction with FIG. 2A to FIG. 2D.

Figure 2A:
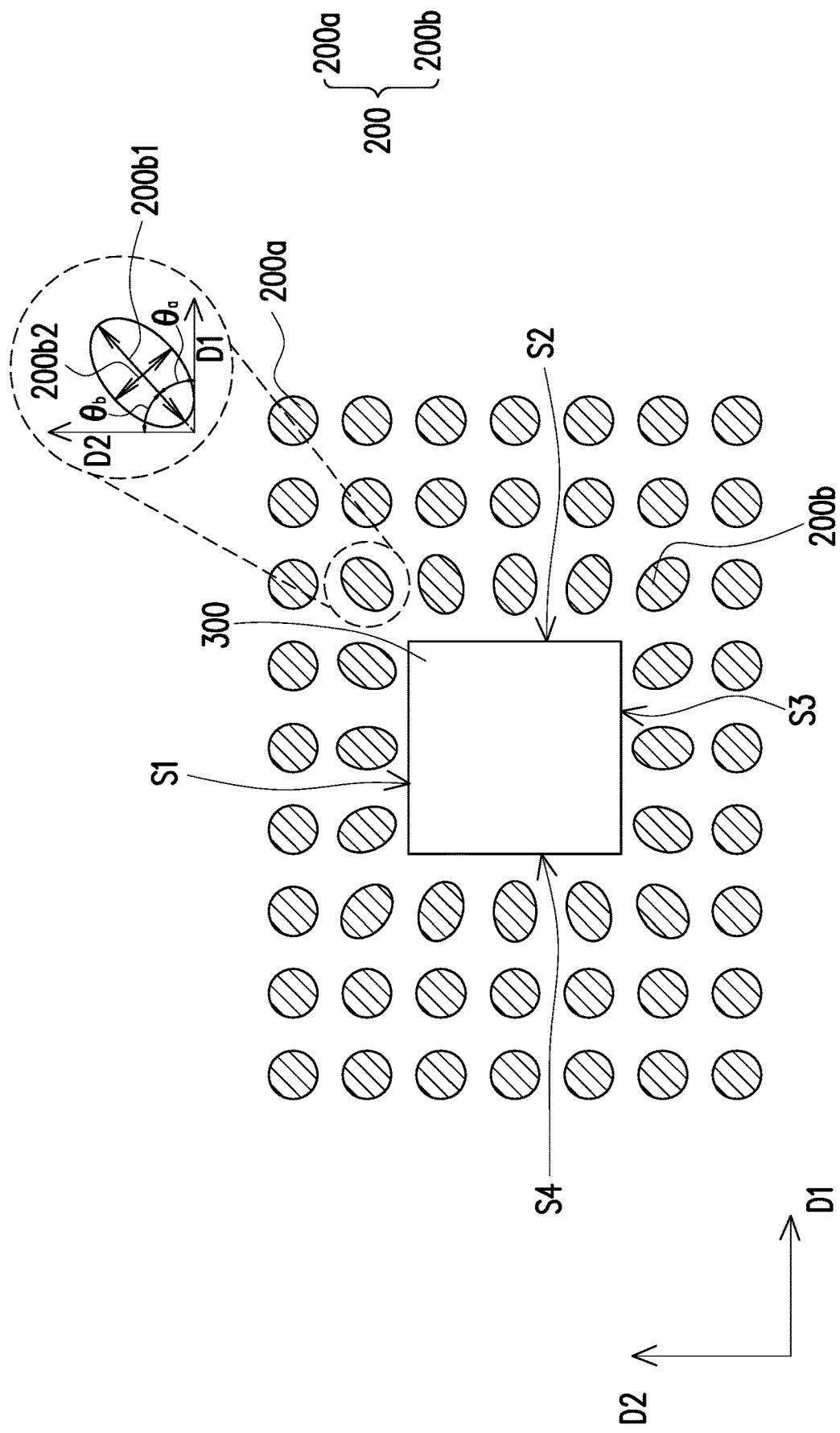
FIG. 2A to FIG. 2D are schematic top views illustrating various arrangements of the conductive structures in FIG. 1B.

FIG. 2A to FIG. 2D are schematic top views illustrating various arrangements of the conductive structures 200 in FIG. 1B. Referring to FIG. 1B and FIG. 2A, in some embodiments, the conductive structures 200 may be constituted by a plurality of first conductive structures 200a and a plurality of second conductive structures 200b. In some embodiments, the first conductive structures 200a include cylindrical columns and the second conductive structures 200b include elliptical columns. As illustrated in FIG. 2A, a top view of the first conductive structures 200a exhibit a circular shape while a top view of the second conductive structures 200b exhibit an elliptical shape. In other words, a cross-section of the first conductive structures 200a parallel to the rear surface 300a of the die 300 is a circle and a cross-section of the second conductive structures 200b parallel to the rear surface 300a of the die 300 is an ellipse. As illustrated in FIG. 2A, the ellipse (the cross-section of the second conductive structure 200b) has a long-axis 200b1 and a short-axis 200b2. In some embodiments, a ratio of the long-axis 200b1 to the short-axis 200b2 is greater than 1 and less than 8.

Referring to FIG. 2A, the second conductive structures 200b are disposed closer to the die 300 than the first conductive structures 200a. For example, the second conductive structures 200b may be disposed to encircle the die 300 in a radial manner, and the first conductive structures 200a may be disposed to surround the second conductive structures 200b. In some embodiments, some of the second conductive structures 200b are arranged to be tilted with respect to extending directions of the sidewalls of the die 300. For example, the die 300 may be a parallelogram having four sides S1-S4 connected to each other. The side S1 and the side S3 extend along a first direction D1 while the side S2 and the side S4 extend along a second direction D2. The first direction D1 is perpendicular to the second direction D2. In some embodiments, the long-axis 200b1 of the ellipse (the cross-section of the second conductive structures 200b) forms an included angle $\theta_a$ of 0° to 90° with the first direction D1. In some embodiments, the long-axis 200b1 of the ellipse (the cross-section of the second conductive structures 200b) forms an included angle $\theta_b$ of 0° to 90° with the second direction D2 In other words, the long-axes 200b1 of the cross-sections of the second conductive structures 200b are aligned with virtual lines extending radially outward from a center of the die 300 toward edges of the package 10 formed subsequently.

Figure 2B:
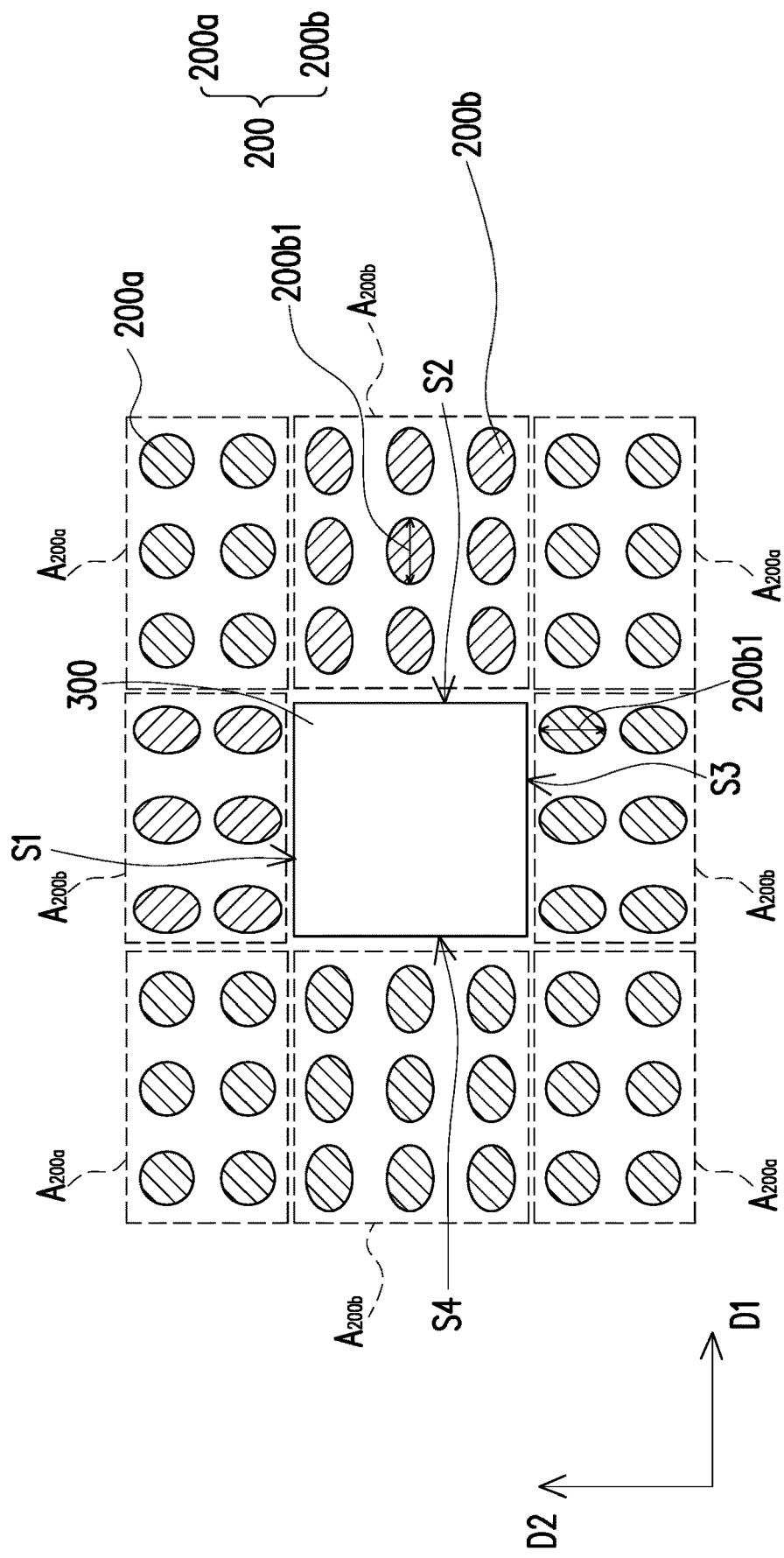

Referring to FIG. 2B, an alternative configuration of the conductive structures 200 is provided. As illustrated in FIG. 2B, the first conductive structures 200a (cylindrical columns) are arranged into a plurality of first conductive structure arrays $A_{200a}$ and the second conductive structures 200b (elliptical columns) are arranged into a plurality of second conductive structure arrays $A_{200b}$. In some embodiments, the second conductive structure arrays $A_{200b}$ are disposed next to the sides S1-S4 of the die 300 and the first conductive structure arrays $A_{200a}$ are disposed next to four corners of the die 300. For example, as illustrated in FIG. 2B, each of the second conductive structure arrays $A_{200b}$ is sandwiched between two adjacent first conductive structure arrays $A_{200a}$. In some embodiments, the long-axes 200b1 of the cross-sections of the second conductive structures 200b (elliptical columns) arranged next to the sides S1 and S3 (extending along the first direction D1) are parallel to the second direction D2. Similarly, the long-axes 200b1 of the cross-sections of the second conductive structures 200b (elliptical columns) arranged next to the sides S2 and S4 (extending along the second direction D2) are parallel to the first direction D1. In other words, in some embodiments, the second conductive structures 200b are not arranged in a radial manner around the die 300. However, the foregoing arrangement construes no limitation in the disclosure. In some alternative embodiments, the first conductive structures 200a and the second conductive structures 200b may be arranged in a manner similar to the configuration depicted in FIG. 2B except the second conductive structures 200b in the second conductive structure arrays $A_{200b}$ are tilted with respect to the extending direction of the sidewalls of the die 300. In other words, the second conductive structures 200b in the second conductive structure arrays $A_{200b}$ may be arranged in a radial manner around the die 300.

Figure 2C:
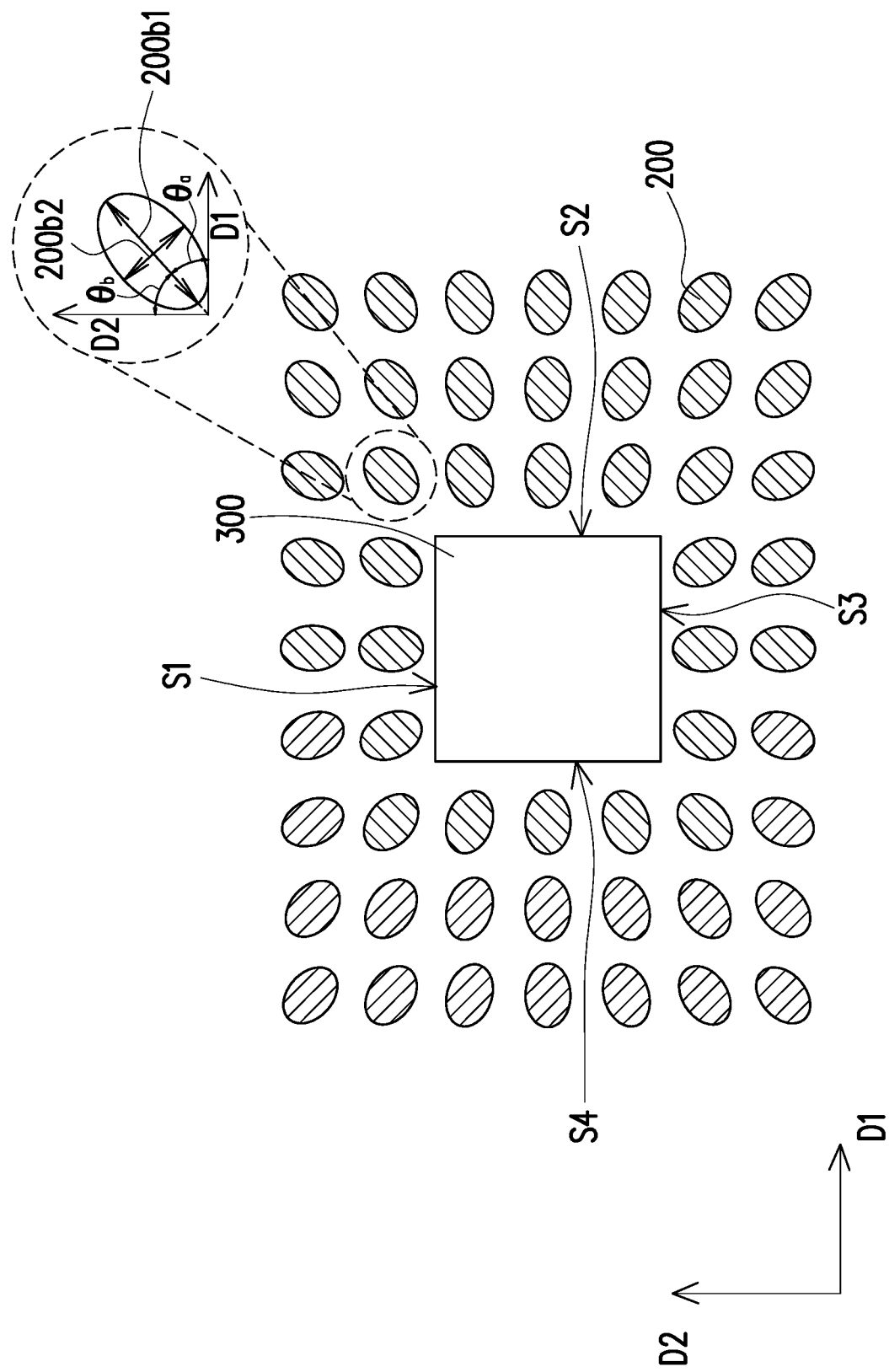

Referring to FIG. 2C, an alternative configuration of the conductive structures 200 is provided. As illustrated in FIG. 2C, the configuration of the conductive structures 200 is similar to that of FIG. 2A except all of the conductive structures 200 are elliptical columns. For example, some of the conductive structures 200 are arranged to be tilted with respect to the extending direction of the sidewalls of the die 300. In some embodiments, the long-axis 200b1 of the ellipse (the cross-section of the conductive structures 200) forms an included angle $\theta_a$ of 0° to 90° with the first direction D1. In some embodiments, the long-axis 200b1 of the ellipse (the cross-section of the conductive structures 200) forms an included angle $\theta_b$ of 0° to 90° with the second direction D2 In other words, the long-axes 200b1 of the cross-sections of the conductive structures 200 are aligned with virtual lines extending radially outward from a center of the die 300 toward edges of the package 10 formed subsequently.

Figure 2D:
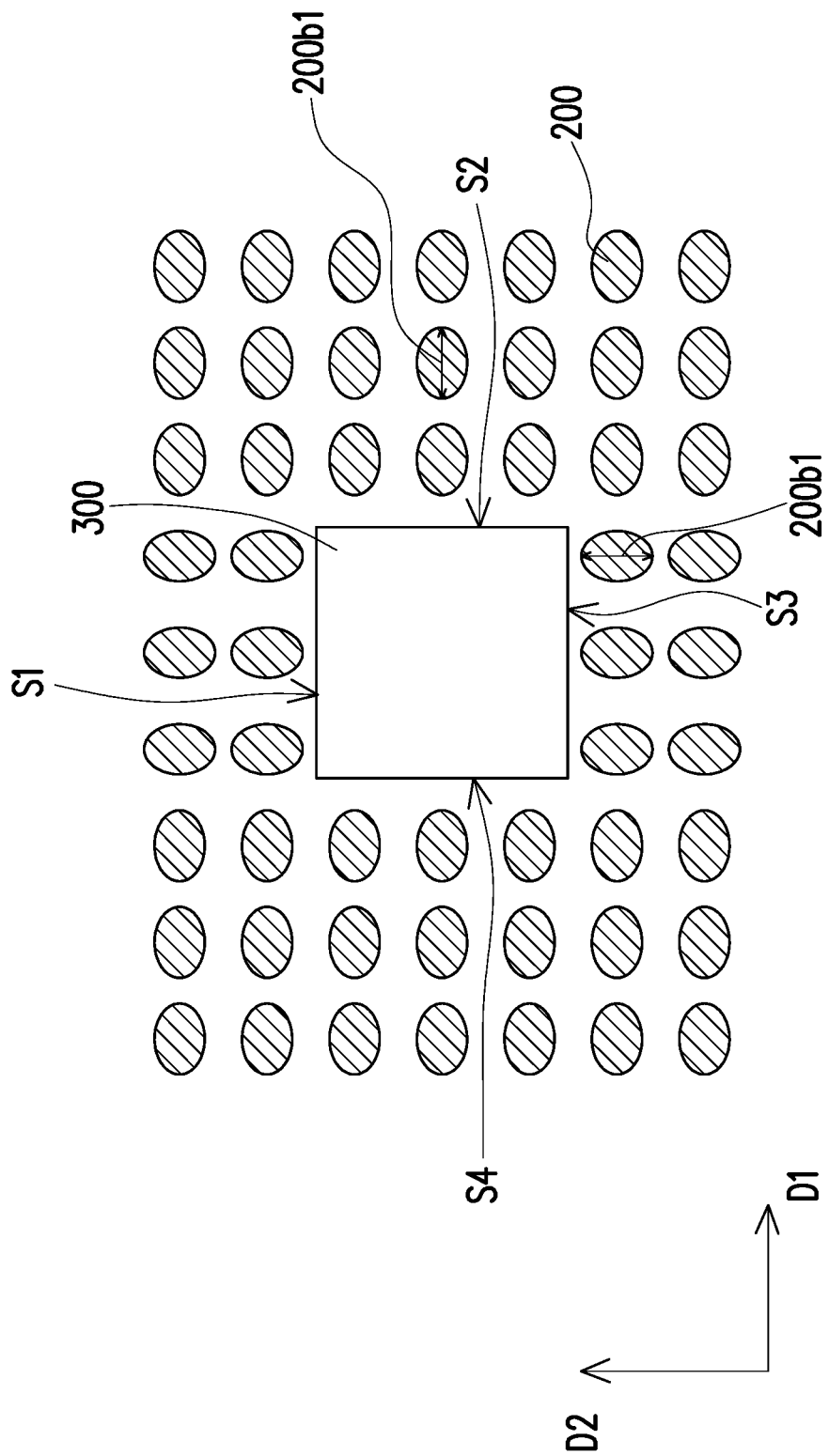

Referring to FIG. 2D, an alternative configuration of the conductive structures 200 is provided. As illustrated in FIG. 2D, the conductive structures 200 disposed on two opposite sides (i.e. the sides S1 and S3) of the die 300 are arranged along a same direction. On the other hand, the conductive structures 200 disposed on another two opposite sides (i.e. the sides S2 and S4) of the die 300 are arranged along another direction. For example, the long-axes 200b1 of the cross-sections of the conductive structures 200 arranged by the sides S1 and S3 are parallel to the second direction D2. Similarly, the long-axes 200b1 of the cross-sections of the conductive structures 200 arranged by the sides S2 and S4 are parallel to the first direction D1. In other words, the conductive structures 200 are not arranged in a radial manner around the die 300. The conductive structures 200 are arranged to have long-axes 200b1 either parallel or perpendicular to the first direction D1.

In some embodiments, the conductive structures 200 are not limited to conductive columns having straight sidewalls. For example, in some alternative embodiments, the conductive structures 200 may include conductive posts having tapered sidewalls. The conductive structures 200 having tapered sidewalls will be discussed below in conjunction with FIG. 3.

Figure 3:
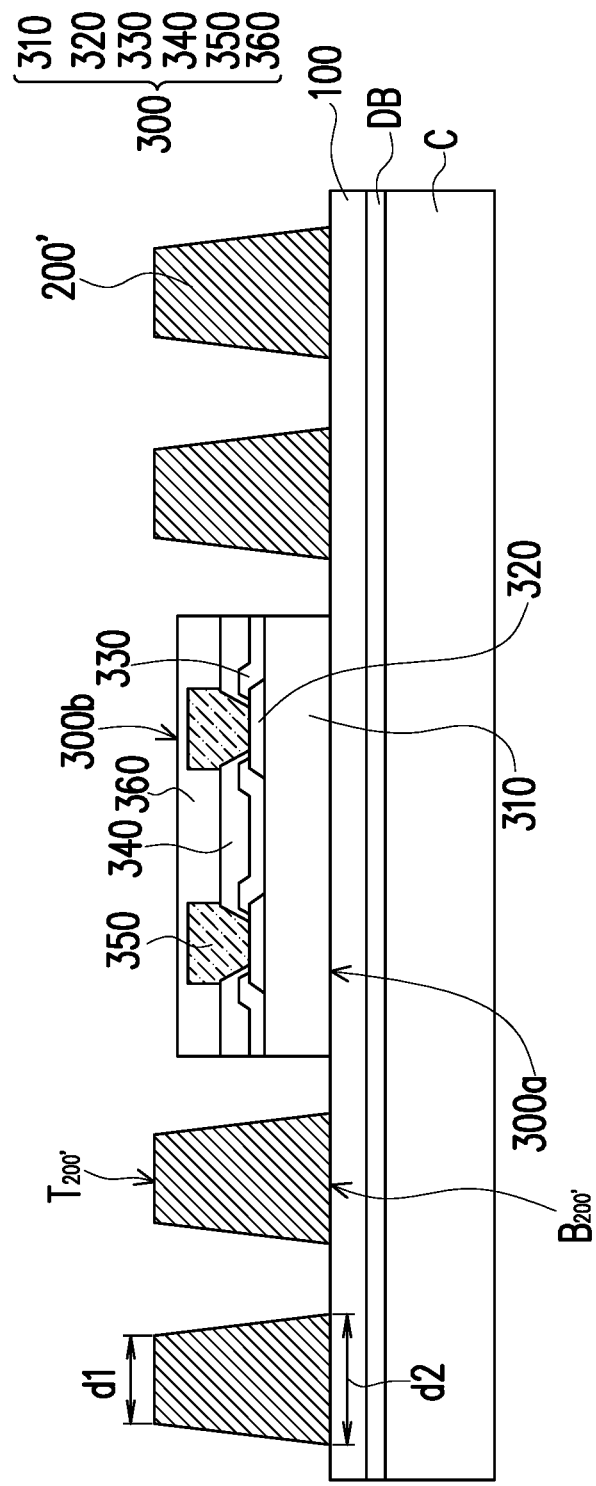
FIG. 3 is a schematic cross-sectional view illustrating an alternative embodiment of the manufacturing step depicted in FIG. 1B.

FIG. 3 is a schematic cross-sectional view illustrating an alternative embodiment of the manufacturing step depicted in FIG. 1B. Referring to FIG. 3, in some embodiments, the conductive structures 200' include conical frustums. In some embodiments, each of the conductive structures 200' (conical frustums) has a top surface $T_{200'}$ and a bottom surface $B_{200'}$. The bottom surface $B_{200'}$ is attached to the dielectric layer 100. On the other hand, the top surface $T_{200'}$ faces upward and is exposed. In some embodiments, the top surface $T_{200'}$ and the bottom surface $B_{200'}$ are circular, and a diameter d1 of the top surface $T_{200'}$ is smaller than a diameter d2 of the bottom surface $B_{200'}$. For example, a ratio of the diameter d1 of the top surface $T_{200'}$ to the diameter d2 of the bottom surface $B_{200'}$ may be greater than 0.5 and less than 1. In other words, an area of the bottom surface $B_{200'}$ is larger than an area of the top surface $T_{200'}$. In some embodiments, the conductive structures 200' may be constituted by cylindrical columns and conical frustums. For example, the conductive structures 200' may be arranged in a manner similar to the configurations illustrated in FIG. 2A or FIG. 2B. In other words, the conical frustums may be arranged closer to the die 300 than the cylindrical columns. Alternatively, the conical frustums may be arranged next to sides S1-S4 of the die 300 and the cylindrical columns may be arranged next to four corners of the die 300. In some embodiments, the conductive structures 200' may be constituted by elliptical columns, cylindrical columns, and conical frustums. In some alternative embodiments, the conductive structures 200' may be a combination of elliptical columns and conical frustums. In some alternative embodiments, all of the conductive structures 200' may be conical frustums.

Referring back to FIG. 1B, in some embodiments, the conductive structures 200 may be formed prior to the placement of the die 300. However, the disclosure is not limited thereto. In some alternative embodiments, the die 300 may be placed before the conductive structures 200 are formed on the dielectric layer 100. As illustrated in FIG. 1B, a top surface of the die 300 is lower than top surfaces of the conductive structures 200. However, the disclosure is not limited thereto. In some alternative embodiments, the top surface of the die 300 may be substantially coplanar with the top surfaces of the conductive structures 200.

Referring to FIG. 1C, an encapsulation material 400 is formed on the dielectric layer 100 to encapsulate the conductive structure 200 and the die 300. The conductive structures 200 and the protection layer 360 of the die 300 are encapsulated by the encapsulation material 400. In other words, the conductive structures 200 and the protection layer 360 of the die 300 are not revealed and are well protected by the encapsulation material 400. In some embodiments, the encapsulation material 400 is a molding compound, a molding underfill, a resin (such as epoxy), or the like. The encapsulation material 400 may be formed by a molding process, such as a compression molding process. In some embodiments, the encapsulation material 400 is applied to a location close to the die 300 from above the structure illustrated in FIG. 1B. Thereafter, a top mold (not shown) is placed over the encapsulation material 400. Subsequently, a force is applied onto the top mold such that the encapsulation material 400 flows from the location close to the die 300 toward the place where the conductive structures 200 are located to encapsulate the die 300 and the conductive structures 200. In some embodiments, since the encapsulation material 400 flows from where the die 300 is located radially outward toward the conductive structures 200, the conductive structures 200 are subjected to torque forces generated from the flow of the encapsulation material 400. If the geometry or the arrangement of the conductive structures is not competent to resist the torque force, the conductive structures may be pushed by the encapsulation material and collapse. The collapsed conductive structures are not able to serve the function of electrically connecting the components on front-side and back-side of the package structure, thereby causing connection fail in the device. Nevertheless, as discussed above in conjunction with FIGS. 2A-2D and 3, at least a portion of the conductive structures 200 includes elliptical column or conical frustums. In some embodiments, the geometry of elliptical columns and the geometry of the conical frustum allow these structures to have stronger resistance against the torque force. In some embodiments, by aligning the long-axes of the cross-sections of the elliptical columns with the travel direction of the torque force, the resistance against the torque force may be further enhanced. As such, by adapting the elliptical columns and/or the conical frustum as the conductive structures 200 and by disposing the conductive structures 200 with a certain orientation, the reliability of the package 10 formed subsequently may be ensured.

Referring to FIG. 1C and FIG. 1D, the encapsulation material 400 and the protection layer 360 of the die 300 are grinded until top surfaces of the conductive vias 350 are exposed. After the encapsulation material 400 is grinded, an encapsulant 400a is formed over the dielectric layer 100 to encapsulate the die 300 and the conductive structures 200. In some embodiments, the encapsulation material 400 is grinded by a mechanical grinding process and/or a chemical mechanical polishing (CMP) process. In some embodiments, during the grinding process of the encapsulation material 400, the protection layer 360 is grinded to reveal the conductive vias 350. In some embodiments, portions of the conductive vias 350 and portions of the conductive structures 200 are slightly grinded as well. After grinding, the die 300 has an active surface 300c and a rear surface 300a opposite to the active surface 300c. The exposed portion of the conductive vias 350 is located on the active surface 300c of the die 300.

The encapsulant 400a encapsulates sidewalls of the die 300, and the encapsulant 400a is penetrated by the conductive structures 200. In other words, the die 300 and the conductive structures 200 are embedded in the encapsulant 400a. It is noted that top surfaces of the conductive structures 200, a top surface of the protection layer 360, and the top surfaces of the conductive vias 350 are substantially coplanar with a top surface of the encapsulant 400a.

Figure 1E:
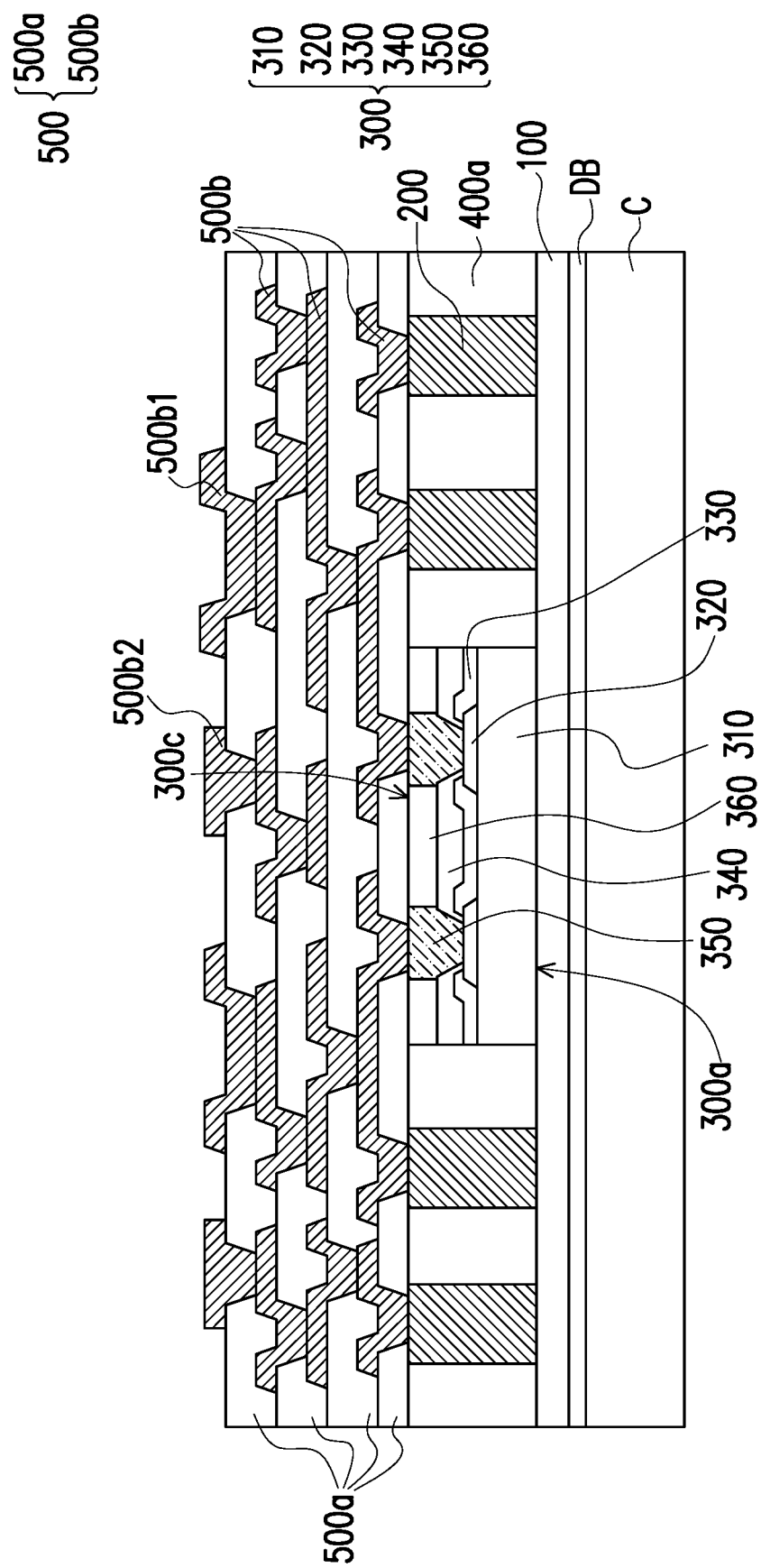

Referring to FIG. 1E, a redistribution structure 500 electrically connected to the conductive vias 350 of the die 300 and the conductive structures 200 is formed on the top surfaces of the conductive structures 200, the top surface of the encapsulant 400a, the top surfaces of the conductive vias 350, and the top surface of the protection layer 360. In other words, the redistribution structure 500 is formed on the active surface 300c of the die 300. In some embodiments, the redistribution structures 500 includes a plurality of inter-dielectric layers 500a and a plurality of redistribution conductive layers 500b stacked alternately. The redistribution conductive layers 500b are electrically connected to the conductive vias 350 of the die 300 and the conductive structures 200 embedded in the encapsulant 400a. In some embodiments, the top surfaces of the conductive vias 350 and the top surfaces of the conductive structures 200 are in contact with the bottommost redistribution conductive layer 500b of the redistribution structure 500. In some embodiments, the top surfaces of the conductive vias 350 and the top surfaces of the conductive structures 200 are partially covered by the bottommost inter-dielectric layer 500a. As illustrated in FIG. 1E, the topmost redistribution conductive layer 500b includes a plurality of pads. In some embodiments, the above-mentioned pads include a plurality of under-ball metallurgy (UBM) patterns 500b1 for ball mount and/or at least one connection pads 500b2 for mounting of passive components. The number of the inter-dielectric layers 500a and the redistribution conductive layers 500b is not limited in the disclosure. In some embodiments, the configurations of the UBM patterns 500b1 and the connection pads 500b2 may be determined based on circuit design.

Figure 1F:
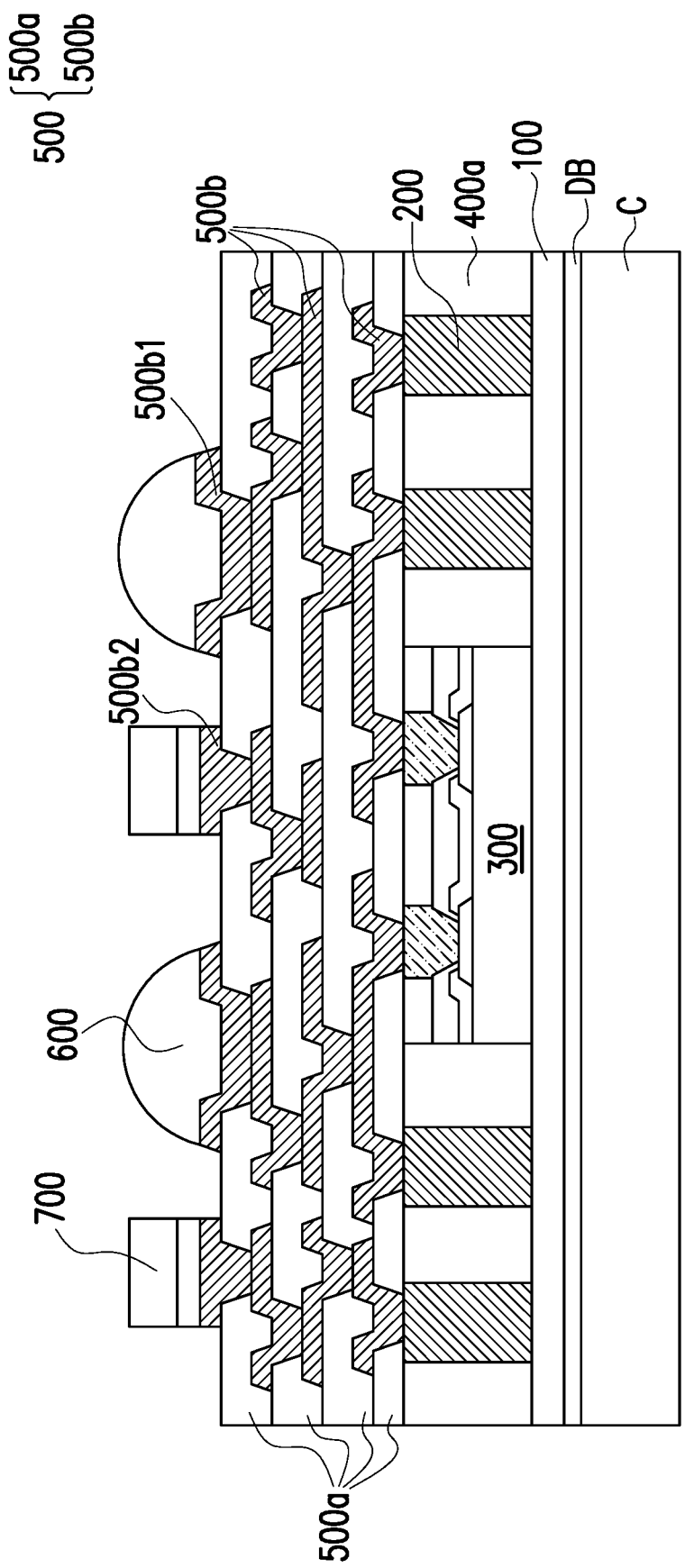

Referring to FIG. 1F, after the redistribution structure 500 is formed, a plurality of conductive terminals 600 are placed on the UBM patterns 500b1 and a plurality of passive components 700 are mounted on the connection pads 500b2. In some embodiments, the conductive terminal 600 includes solder ball. On the other hand, the passive component 700 is, for example, a capacitor, a resistor, an inductor, an antenna, the like, or a combination thereof. In some embodiments, the conductive terminals 600 may be placed on the UBM patterns 500b1 through a ball placement process and the passive components 700 may be mounted on the connection pads 500b2 through a soldering process and/or a reflowing process.

Figure 1G:
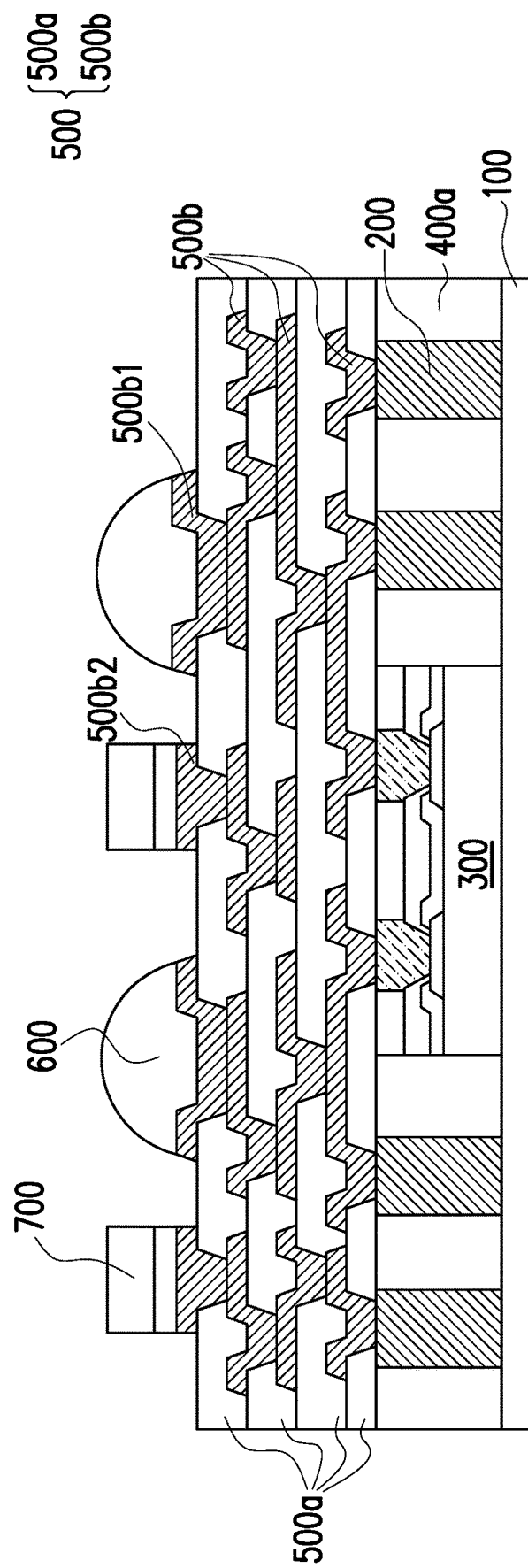

Referring to FIG. 1F and FIG. 1G, after the conductive terminals 600 and the passive components 700 are mounted on the redistribution structure 500, the dielectric layer 100 formed on the bottom surface of the encapsulant 400a is de-bonded from the de-bonding layer DB such that the dielectric layer 100 is separated from the carrier C. In some embodiments, the de-bonding layer DB (e.g., the LTHC release layer) may be irradiated by an UV laser such that the dielectric layer 100 adhered on the bottom surface of the encapsulant 400a may be peeled off from the carrier C.

Figure 1H:
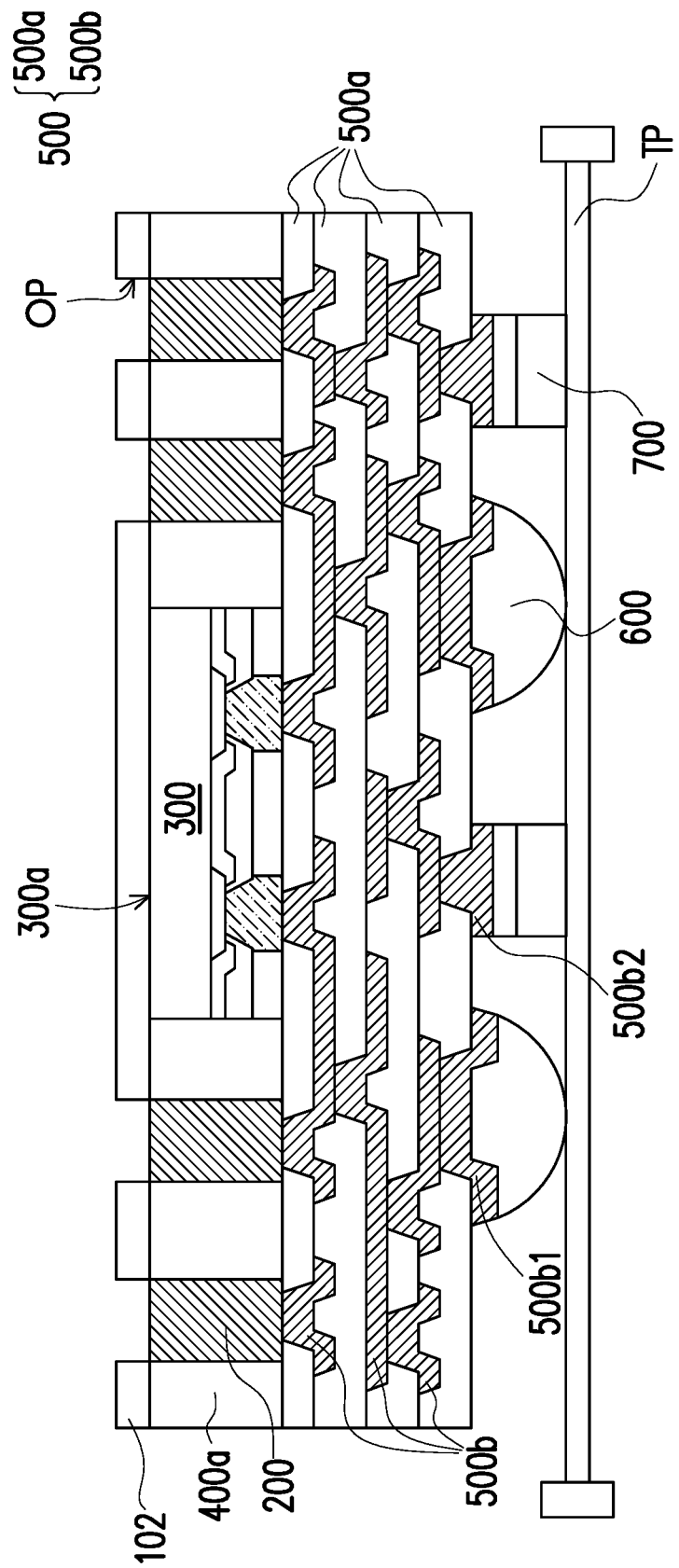

Referring to FIG. 1G and FIG. 1H, the structure illustrated in FIG. 1G is flipped upside down and is placed onto a tape TP. Thereafter, the dielectric layer 100 on the encapsulant 400a and the rear surface 300a of the die 300 is patterned to form a dielectric layer 102 having a plurality of elliptical openings OP. The elliptical openings OP at least partially expose the conductive structures 200. In some embodiments, the number of the elliptical openings OP corresponds to the number of the conductive structures 200. However, the disclosure is not limited thereto. In some alternative embodiments, the number of the elliptical openings OP may be more than the number of the conductive structures 200. For example, extra elliptical openings OP may be formed to expose the rear surface 300a of the die 300 for future dummy joint terminal formation. In some embodiments, the elliptical openings OP of the dielectric layer 102 are formed by a laser drilling process.

Figure 1I:
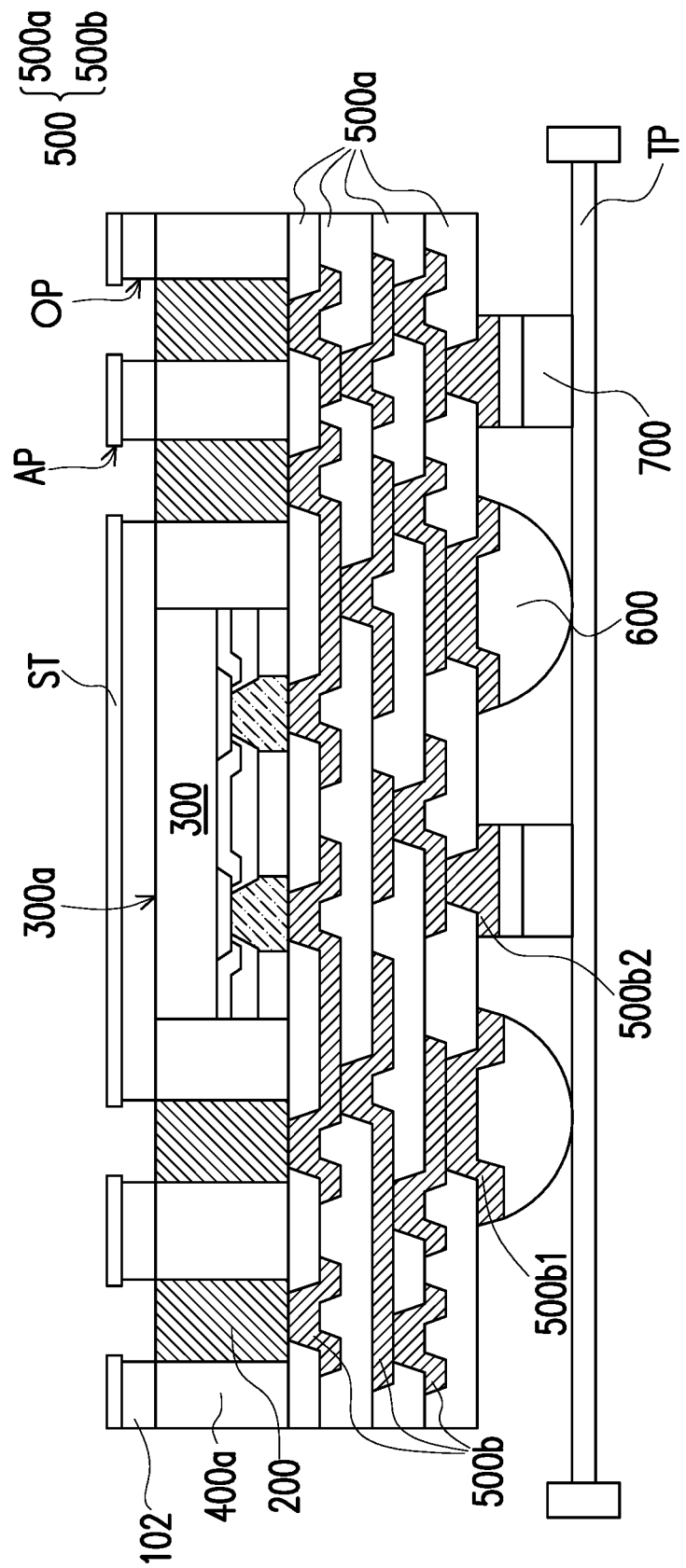
Figure 4:
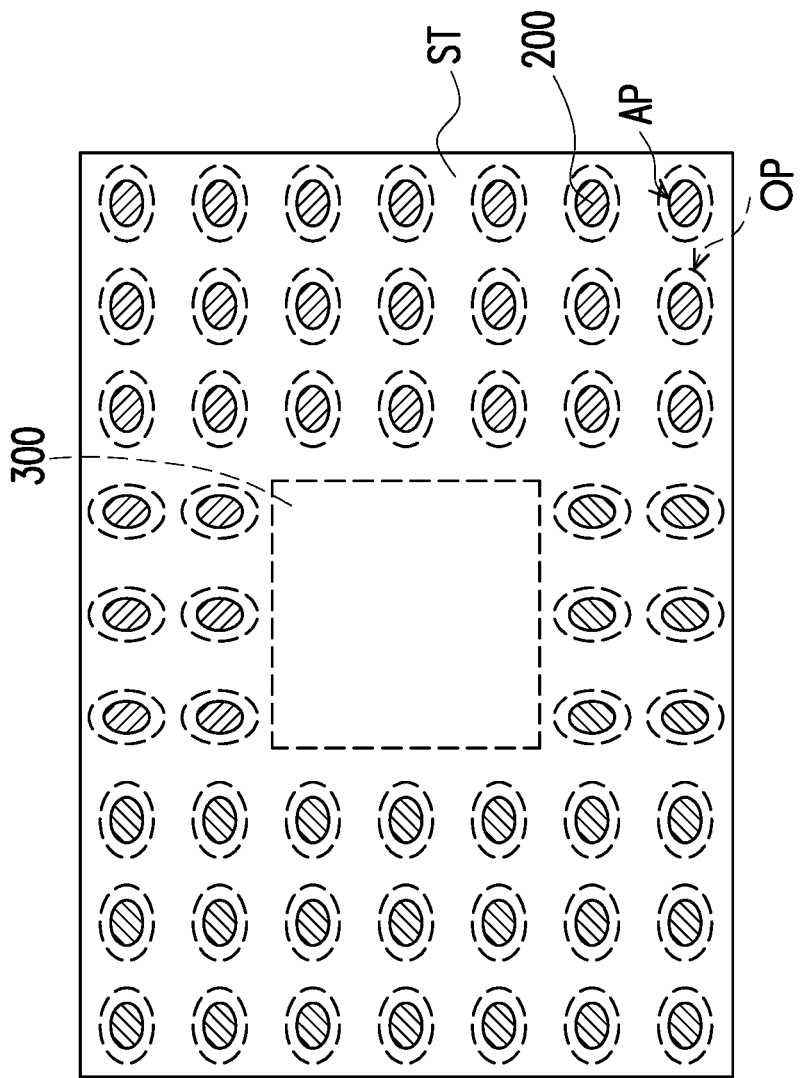
FIG. 4 is a schematic top view illustrating the stencil and the elliptical openings of the dielectric layer in FIG. 1I.

Referring to FIG. 1I, a stencil ST is placed over the dielectric layer 102. FIG. 4 is a schematic top view illustrating the stencil ST and the elliptical openings OP of the dielectric layer 102 in FIG. 1I. The relative configuration of the stencil ST and the dielectric layer 102 will be described below in conjunction with FIG. 1I and FIG. 4. Referring to FIG. 1I and FIG. 4, the stencil ST has a plurality of elliptical apertures AP. In some embodiments, a shape of the elliptical apertures AP of the stencil ST corresponds to a shape of the elliptical openings OP of the dielectric layer 102. For example, both of the elliptical apertures AP and the elliptical openings OP may have a shape of ellipse from a top view. In some embodiments, a profile of the elliptical apertures AP is conformal with a profile of the elliptical openings OP. In some embodiments, the elliptical apertures AP of the stencil ST is smaller than or equal to the size of the elliptical openings OP of the dielectric layer 102. For example, the elliptical openings OP may have a diameter (long-axis) of 100 µm to 200 µm while the elliptical apertures AP may have a diameter (long-axis) of 70 µm to 200 µm. In some embodiments, the stencil ST is placed over the dielectric layer 102 such that the elliptical apertures AP and the elliptical openings OP are coaxial. As illustrated in FIG. 4, the elliptical openings OP and the elliptical apertures AP expose at least a portion of each conductive structure 200. In some embodiments, a thickness of the stencil ST ranges from 50 µm to 150 µm.

Figure 1J:
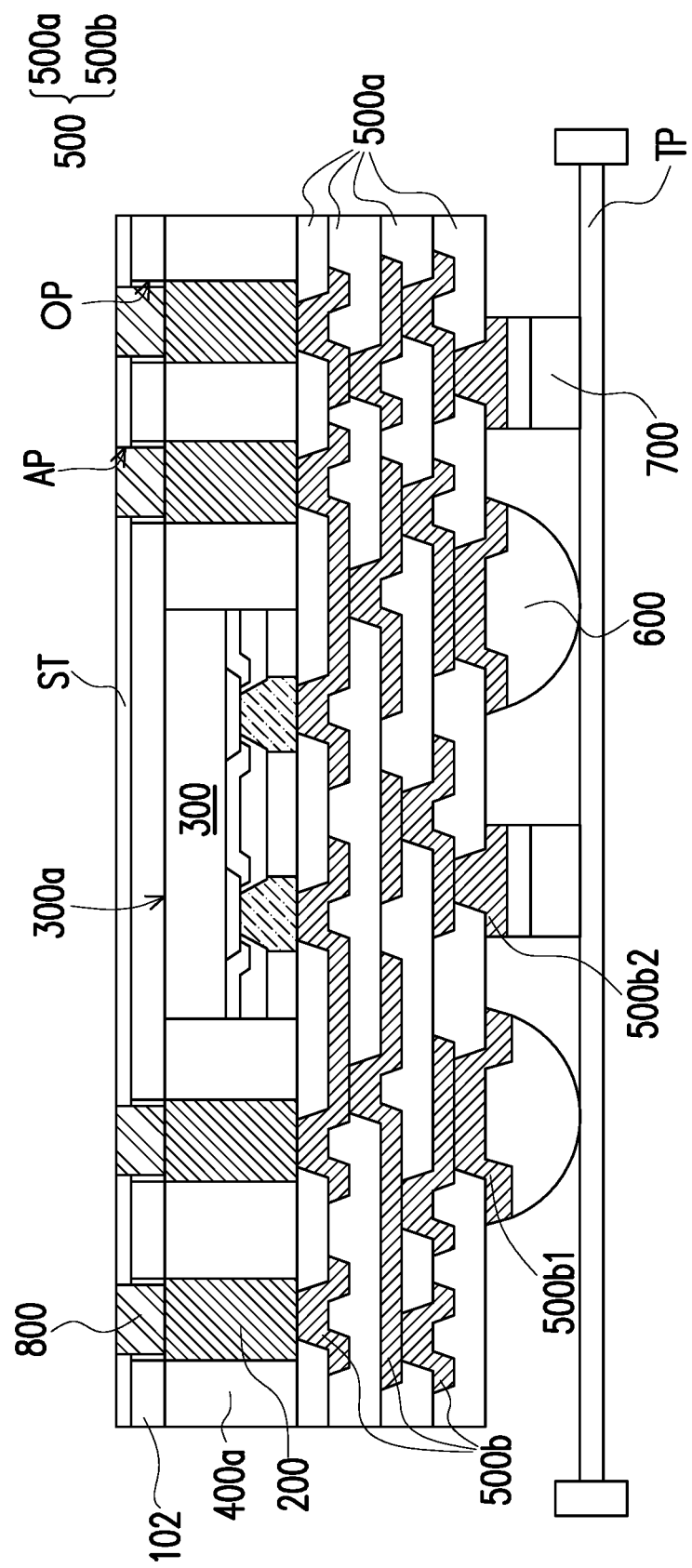

Referring to FIG. 1J, a conductive paste 800 is applied onto the exposed portion of the conductive structures 200. For example, the conductive paste 800 is applied onto the stencil ST by a dispenser (not shown). Subsequently, a squeegee (not shown) may be adapted to scrape the conductive paste 800 into the elliptical apertures AP of the stencil and the elliptical openings OP of the dielectric layer 102. In other words, the conductive paste 800 is filled into the elliptical openings OP of the dielectric layer 102 and the elliptical apertures AP of the stencil ST. In some embodiments, the elliptical nature of the elliptical openings OP and the elliptical apertures AP shapes the conductive paste 800 filled therein to a shape of elliptical column/elliptical tablet. In some embodiments, the conductive paste 800 may include solder paste or other suitable pastes.

Figure 1K:
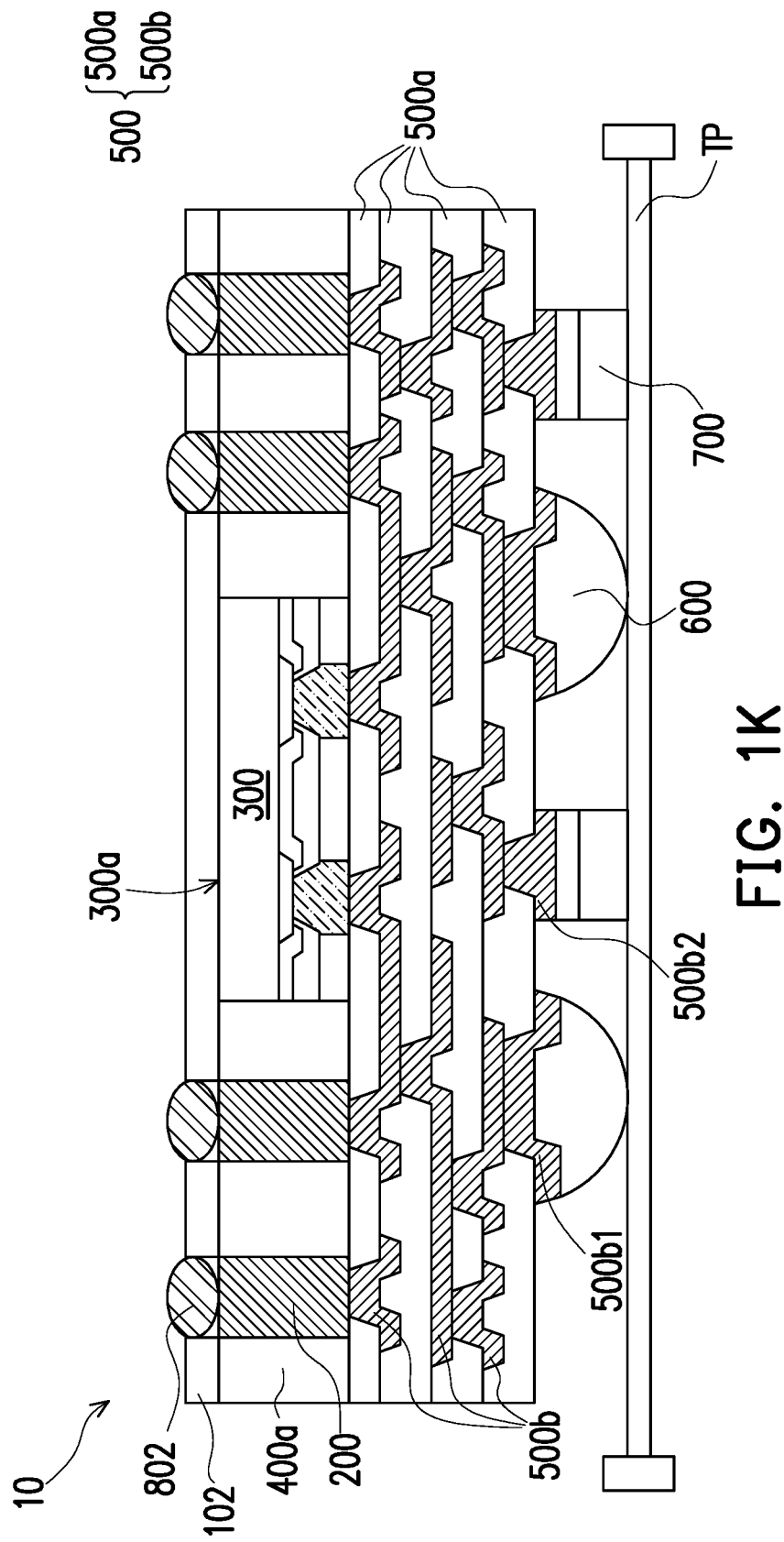

Referring to FIG. 1J and FIG. 1K, the stencil ST is then removed, and the conductive paste 800 is cured to form a plurality of joint terminals 802 in the elliptical openings OP. In some embodiments, the curing process of the conductive paste 800 may include a reflowing process. As illustrated in FIG. 1K, the joint terminals 802 include ellipsoids. In some embodiments, the joint terminals 802 protrude from the surface of the dielectric layer 102 for future electrical connection. At this stage, the package 10 is substantially completed.

In some embodiments, the geometry and the arrangement of the joint terminals 802 play significant roles in ensuring the reliability of the subsequently formed PoP structure 1000. The configuration of the joint terminals 802 will be described in detail below in conjunction with FIG. 5A and FIG. 5B.

Figure 5A:
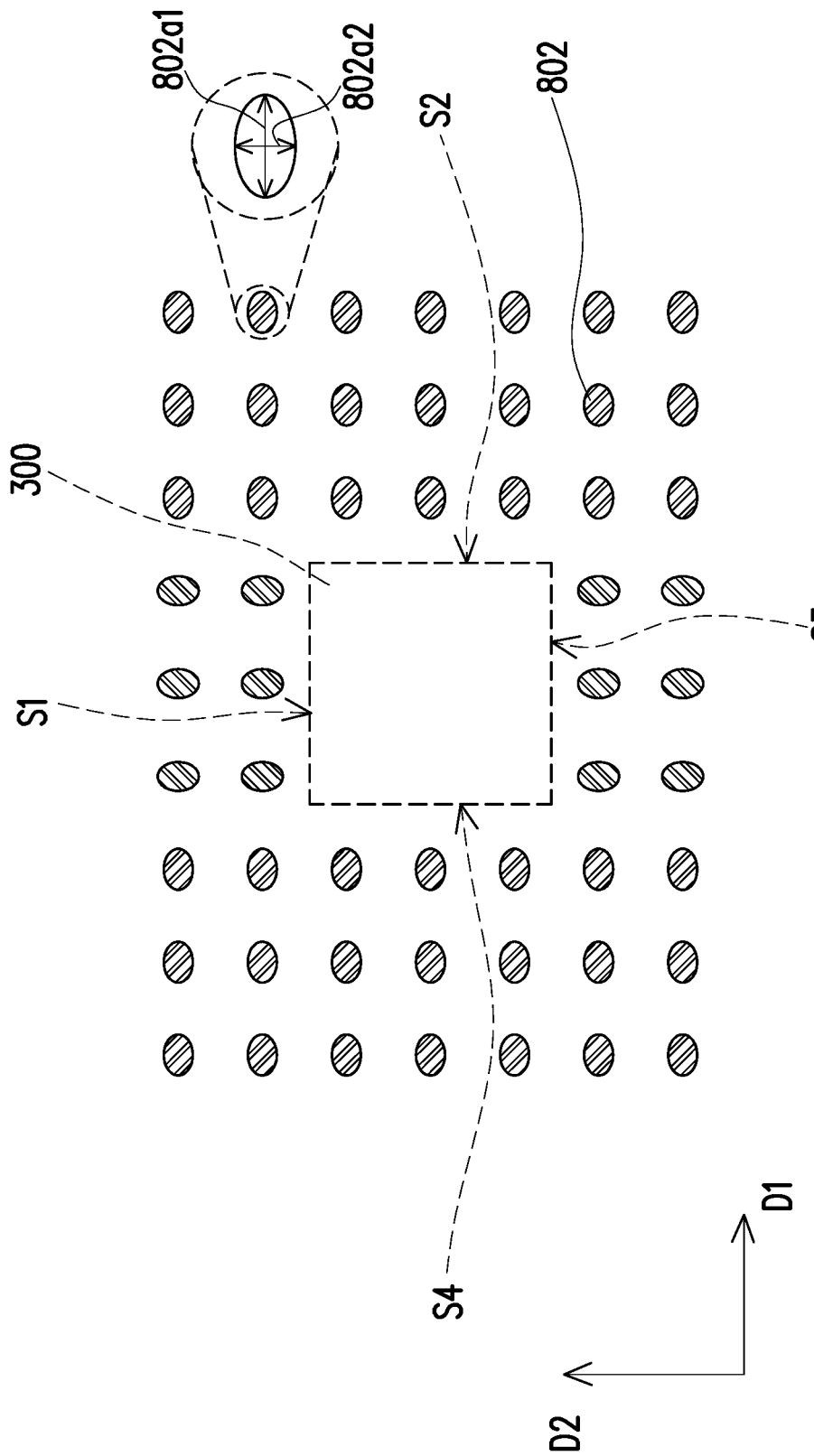
FIG. 5A and FIG. 5B are schematic top views illustrating various arrangement of the joint terminals in FIG. 1K.
Figure 5B:
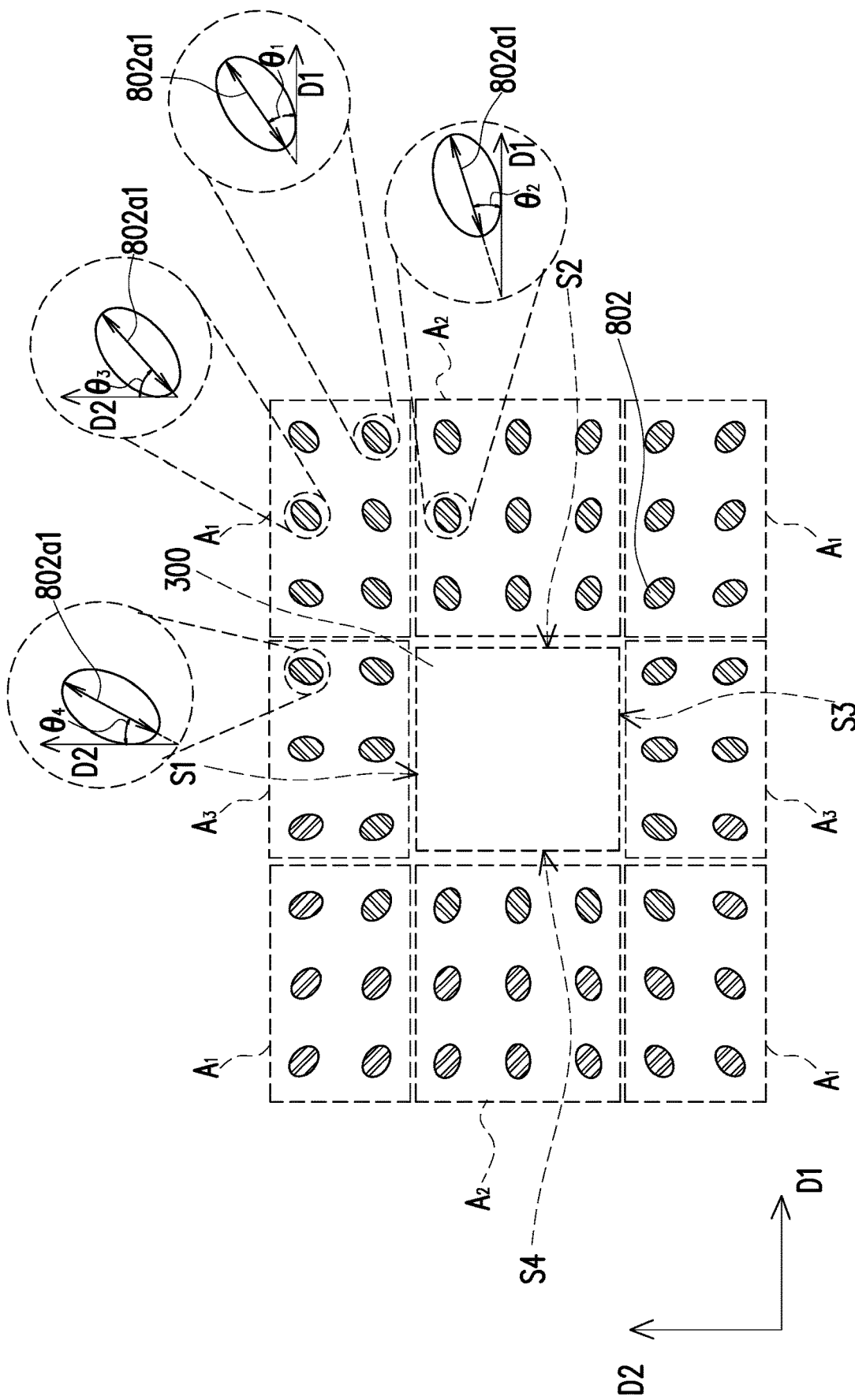

FIG. 5A and FIG. 5B are schematic top views illustrating various arrangement of the joint terminals 802 in FIG. 1K. Referring to FIG. 1K and FIG. 5A, the top view of each joint terminal 802 exhibits an elliptical shape. In other words, a cross-section of the joint terminals 802 parallel to the rear surface 300a of the die 300 is an ellipse. As illustrated in FIG. 5A, the ellipse (the cross-section of the joint terminals 802) has a long-axis 802a1 and a short-axis 802a2. In some embodiments, a ratio of the short-axis 802a2 of the cross-section to the long-axis 802a1 of the cross-section ranges between 0.2 and 0.9 or between 1.1 and 3.

Referring to FIG. 5A, the joint terminals 802 disposed on two opposite sides (i.e. the sides S1 and S3) of the die 300 are arranged along a same direction. On the other hand, the joint terminals 802 disposed on another two opposite sides (i.e. the sides S2 and S4) of the die 300 are arranged along another direction. For example, the long-axes 802a1 of the cross-sections of the joint terminals 802 arranged by the sides S1 and S3 are parallel to the second direction D2. Similarly, the long-axes 802a1 of the cross-sections of the joint terminals 802 arranged by the sides S2 and S4 are parallel to the first direction D1. In other words, the joint terminals 802 are arranged to have long-axes 802a1 either parallel or perpendicular to the first direction D1.

Referring to FIG. 5B, an alternative configuration of the joint terminals 802 is provided. As illustrated in FIG. 5B, some of the joint terminals 802 are arranged to be tilted with respect to the extending direction of the sidewalls of the die 300. In some embodiments, the long-axis 802a1 of the ellipse (the cross-section of the joint terminals 802) forms an included angle of 0° to 90° with the first direction D1. In some embodiments, the long-axis 802a1 of the ellipse (the cross-section of the joint terminals 802) forms an included angle of 0° to 90° with the second direction D2. As illustrated in FIG. 5B, the joint terminals 802 are arranged into a plurality of first joint terminal arrays A1, a plurality of second joint terminal arrays A2, and a plurality of third joint terminal arrays A3. In some embodiments, the third joint terminal arrays A3 are disposed above a region next to the sides S1 and S3 of the die 300, and the second joint terminals arrays A2 are disposed above a region next to sides S2 and S4 of the die 300. On the other hand, the first joint terminal arrays A1 may be disposed above a region next to four corners of the die 300. For example, as illustrated in FIG. 5B, each of the second joint terminal arrays A2 are sandwiched between two adjacent first joint terminal arrays A1. Similarly, each of the third joint terminal arrays A3 are sandwiched between two adjacent first joint terminal arrays A1.

In some embodiments, the first direction D1 and the long-axis 802a1 of the cross-section of each joint terminal 802 of the first joint terminal arrays A1 forms a first included angle $\theta_1$. On the other hand, the first direction D1 and the long-axis 802a1 of the cross-section of each joint terminals 802 of the second joint terminal arrays A2 forms a second included angle $\theta_2$. As illustrated in FIG. 5B, in some embodiments, since the joint terminals 802 of the first joint terminal arrays A1 are arranged to be more tilted than the joint terminals 802 of the second joint terminal arrays A2 with respect to the first direction D1, the first included angle $\theta_1$ is larger than the second included angle $\theta_2$. For example, the first included angle $\theta_1$ may range between 0° and 80° and the second included angle $\theta_2$ may range between 0° and 45°. In some embodiments, the second direction D2 and the long-axis 802a1 of the cross-section of each joint terminal 802 of the first joint terminal arrays A1 forms a third included angle $\theta_3$. On the other hand, the second direction D2 and the long-axis 802a1 of the cross-section of each joint terminals 802 of the third joint terminal arrays A3 forms a fourth included angle $\theta_4$. As illustrated in FIG. 5B, in some embodiments, since the joint terminals 802 of the first joint terminal arrays A1 are arranged to be more tilted than the joint terminals 802 of the third joint terminal arrays A3 with respect to the second direction D2, the third included angle $\theta_3$ is larger than the fourth included angle $\theta_4$. For example, the third included angle $\theta_3$ may range between 0° and 80° and the fourth included angle $\theta_4$ may range between 0° and 45°. In some embodiments, the long-axes 802a1 of the cross-sections of the joint terminals 802 are aligned with virtual lines extending radially outward from a center of the die 300 toward edges of the package 10.

In some embodiments, an orientation of the joint terminals 802 may correspond to orientation of the conductive structures 200. In some embodiments, in a case where the joint terminals 802 are ellipsoids and the conductive structures 200 are elliptical columns, the long-axes 802a1 of the cross-section of the joint terminals 802 may be parallel to or aligned with the long-axes 200b1 of the cross-section of the corresponding conductive structures 200. For example, the configuration of joint terminals 802 illustrated in FIG. 5A is similar to the configuration of conductive structures 200 illustrated in FIG. 2D, and the configuration of joint terminals 802 illustrated in FIG. 5B is similar to the configuration of the conductive structures 200 illustrated in FIG. 2C.

Although FIG. 5A and FIG. 5B illustrated that the joint terminals 802 are not formed directly above the die 300, the disclosure is not limited thereto. As mentioned above, during the step of FIG. 1H, extra elliptical openings OP may be formed to expose the rear surface 300a of the die 300. In some alternative embodiments, a plurality of dummy joint terminals (not shown) may be formed in these extra elliptical openings OP over the die 300. The dummy joint terminal may further strengthen the bonding between the package 10 and other subsequently formed elements over the joint terminals 802 and the dummy joint terminals, thereby enhancing the mechanical strength between the two.

Moreover, although the steps shown in FIG. 1A to FIG. 1K are directed to an integrated fan-out (InFO) package as an exemplary illustration, the disclosure is not limited thereto. In some alternative embodiments, the formation method and the configurations of the joint terminals 802 shown in FIGS. 1H-1K, 4, 5A-5B may be adapted in other types of package structures. For example, a Chip on Wafer on Substrate (CoWoS) package may also utilize the steps shown in FIGS. 1H-1K, 4, 5A-5B to form joint terminals.

Figure 1L:
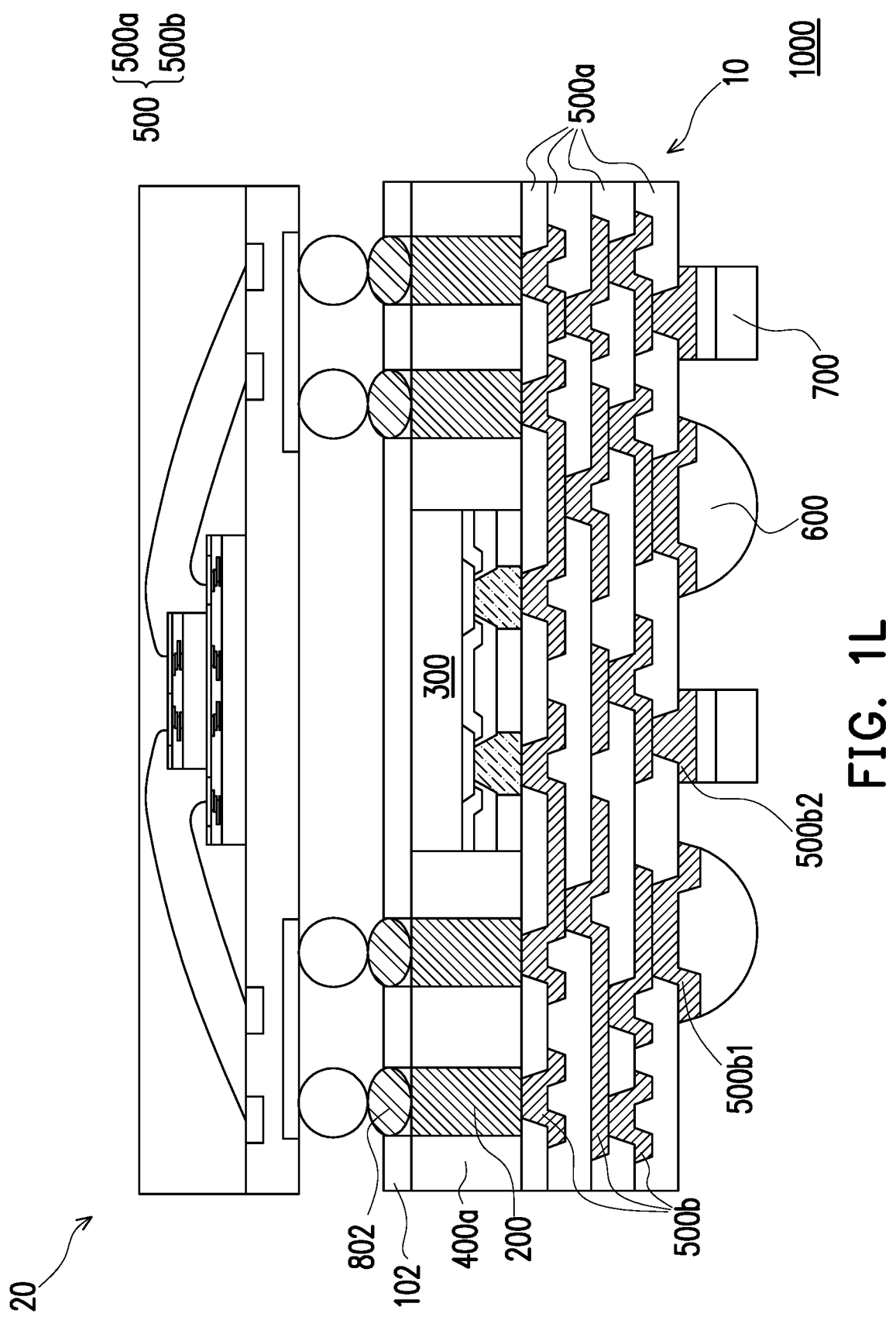

Referring to FIG. 1L, a sub-package 20 is stacked on the package 10 to obtain a package-on-package (PoP) structure 1000. In some embodiments, the package 10 may be referred to as the first package and the sub-package 20 may be referred to as the second package. As mentioned above, the package 10 may include an InFO package, a CoWoS package, or other types of packages. In some embodiments, the sub-package 20 is, for example, a memory device or other IC packages. In some embodiments, the sub-package 20 is electrically connected to the package 10 through the joint terminals 802. In some embodiments, after the sub-package 20 is stacked on the package 10, a reflowing process is further performed. During the stacking process and/or the reflowing process, stress may be generated to cause cold joint defect, thereby compromising the reliability of the PoP structure. In some embodiments, the stress emits radially outward from a center towards edges of the PoP structure. As shown in FIGS. 1H-1K, 4, 5A-5B, the joint terminals 802 are formed as ellipsoids with various orientations. In some embodiments, the geometry and the orientation of ellipsoids allow the joint terminals 802 to release the stress generated during the stacking process and/or the reflowing process. As such, by adapting ellipsoids with certain orientation as the joint terminals 802, the reliability of the PoP structure 1000 is ensured. It should be noted that although one sub-package 20 is illustrated in FIG. 1L, the number of the sub-package 20 is not limited thereto. In some alternative embodiments, more than one sub-packages may be stacked on the package simultaneously to form the PoP structure.

In accordance with some embodiments of the disclosure, a package includes a die, a plurality of first conductive structures, a plurality of second conductive structures, an encapsulant, and a redistribution structure. The die has an active surface and a rear surface opposite to the active surface. The first conductive structures and the second conductive structures surround the die. The first conductive structures include cylindrical columns and the second conductive structures include elliptical columns or conical frustums. The encapsulant encapsulates the die, the first conductive structures, and the second conductive structures. The redistribution structure is over the active surface of the die and the encapsulant. The redistribution structure is electrically connected to the die, the first conductive structures, and the second conductive structures.

In accordance with some embodiments of the disclosure, a package-on-package (PoP) structure includes a first package and a second package. The first package includes a die, a plurality of conductive structures, an encapsulant, a redistribution structure, a dielectric layer, and a plurality of joint terminals. The die has an active surface and a rear surface opposite to the active surface. The conductive structures surround the die and include elliptical columns. The encapsulant encapsulates the die and the conductive structures. The redistribution structure is over the active surface of the die, the conductive structures, and the encapsulant. The dielectric layer is over the encapsulant and the rear surface of the die. The dielectric layer exposes the conductive structures. The joint terminals are disposed on the conductive structures and includes ellipsoids. The second package is on the first package. The second package is electrically connected to the first package through the joint terminals.

In accordance with some embodiments of the disclosure, a method of manufacturing a package-on-package (PoP) structure includes at least the following steps. A first package is formed. The method of forming the first package includes at least the following steps. A carrier having a dielectric layer formed thereon is provided. A die and a plurality of conductive structures are formed on the dielectric layer. The die has an active surface and a rear surface opposite to the active surface. The conductive structures surround the die. The conductive structures include elliptical columns. The die and the conductive structures are encapsulated by an encapsulant. A redistribution structure is formed on the active surface of the die, the conductive structures, and the encapsulant. The carrier is separated from the dielectric layer. A plurality of elliptical openings is formed in the dielectric layer to expose the conductive structures. A plurality of joint terminals are formed in the elliptical openings of the dielectric layer. The joint terminals include ellipsoids. Thereafter, a second package is stacked on the first package. The second package is electrically connected to the first package through the joint terminals.

In accordance with some alternative embodiments of the disclosure, a package includes a die, a plurality of conductive structures, an encapsulant, and a redistribution structure. The die has an active surface and a rear surface opposite to the active surface. The conductive structures surround the die. The conductive structures include elliptical columns. The encapsulant encapsulates the die and the conductive structures. The redistribution structure is over the active surface of the die and the encapsulant. The redistribution structure is electrically connected to the die and the conductive structures.

In accordance with some alternative embodiments of the disclosure, a package-on-package (PoP) structure includes a first package and a second package. The first package includes a die, a plurality of conductive structures, an encapsulant, and a plurality of joint terminals. The die has a rear surface. The conductive structures surround the die. The conductive structures includes elliptical columns. The encapsulant encapsulates the die and the conductive structures. The joint terminals are disposed on the conductive structures. The joint terminals include ellipsoids. An orientation of the joint terminals corresponds to an orientation of the conductive structures. The second package is on the first package. The second package is electrically connected to the first package through the joint terminals.

In accordance with some alternative embodiments of the disclosure, a method of manufacturing a package-on-package (PoP) structure includes at least the following steps. A first package is formed. The method of forming the first package includes at least the following steps. A die and a plurality of conductive structures are formed on a dielectric layer. The die has a rear surface. The dielectric layer is over the rear surface of the die. The conductive structures surround the die. The conductive structures include elliptical columns. The die and the conductive structures are encapsulated by an encapsulant. The dielectric layer is over the encapsulant. A plurality of elliptical openings is formed in the dielectric layer to expose the conductive structures. A plurality of joint terminals is formed in the elliptical openings of the dielectric layer such that an orientation of the joint terminals corresponds to an orientation of the conductive structures. The joint terminals include ellipsoids. Thereafter, a second package is stacked on the first package. The second package is electrically connected to the first package through the joint terminals.

In accordance with some alternative embodiments of the disclosure, a package includes a die, a plurality of first conductive structures, a plurality of second conductive structures, an encapsulant, and a redistribution structure. The die has an active surface and a rear surface opposite to the active surface. The first conductive structures and the second conductive structures surround the die. A shape of the first conductive structures is different from a shape of the second conductive structures. The second conductive structures include elliptical columns having substantially straight sidewalls. A distance between the first conductive structure that is closest to the die and the die is greater than a distance between the second conductive structure that is closest to the die and the die. The encapsulant encapsulates the die, the first conductive structures, and the second conductive structures. The redistribution structure is over the active surface of the die and the encapsulant. The redistribution structure is electrically connected to the die, the first conductive structures, and the second conductive structures.

In accordance with some alternative embodiments of the disclosure, a package-on-package (PoP) structure includes a first package and a second package. The first package includes a die, a plurality of conductive structures, an encapsulant, and a plurality of joint terminals. The die has a rear surface. The conductive structures surround the die. The conductive structures include elliptical columns. Each of the elliptical columns has a cross-section parallel to the rear surface of the die. The encapsulant encapsulates the die and the conductive structures. The joint terminals are disposed on the conductive structures. The joint terminals include ellipsoids. Each of the ellipsoids has a cross-section parallel to the rear surface of the die. A long-axis of the cross-section of each of the ellipsoid is aligned with a long-axis of the cross-section of the corresponding elliptical column. The second package is on the first package. The second package is electrically connected to the first package through the joint terminals.

In accordance with some alternative embodiments of the disclosure, a method of manufacturing a package-on-package (PoP) structure includes at least the following steps. A first package is formed. The method of forming the first package includes at least the following steps. A die and a plurality of conductive structures are formed on a dielectric layer. The die has a rear surface. The conductive structures surround the die. The conductive structures include elliptical columns, and each of the elliptical columns has a cross-section parallel to the rear surface of the die. The die and the conductive structures are encapsulated by an encapsulant. A plurality of elliptical openings is formed in the dielectric layer to expose the conductive structures. A plurality of joint terminals is formed in the elliptical openings of the dielectric layer and is formed on the conductive structures. The joint terminals include ellipsoids, and each of the ellipsoids has a cross-section parallel to the rear surface of the die. A long axis of the cross-section of the ellipsoid is aligned with a long-axis of the cross-section of the corresponding elliptical column. Thereafter, a second package is stacked on the first package. The second package is electrically connected to the first package through the joint terminals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
a die having a rear surface;
a plurality of first conductive structures and a plurality of second conductive structures surrounding the die, wherein the plurality of first conductive structures comprises cylindrical columns and the plurality of second conductive structures comprises elliptical columns, and at least one of the plurality of second conductive structures is closer to the die than the plurality of the first conductive structures; and
an encapsulant encapsulating the die, the plurality of first conductive structures, and the plurality of second conductive structures.

2. The package according to claim 1, wherein the plurality of second conductive structures encircles the die in a radial manner.

3. The package according to claim 1, wherein the elliptical columns have substantially straight sidewalls, each of the elliptical columns has a cross-section parallel to the rear surface of the die, and a ratio of a long-axis of the cross-section to a short-axis of the cross-section is greater than 1 and less than 8.

4. The package according to claim 1, wherein two opposite sides of the die are arranged along a first direction and another two opposite sides of the die are arranged along a second direction perpendicular to the first direction, each of the elliptical columns has a cross-section parallel to the rear surface of the die, and a long-axis of the cross-section forms an included angle of 0° to 90° with the first direction.

5. The package according to claim 1, wherein the plurality of first conductive structures is arranged into first conductive structure arrays, the plurality of second conductive structures is arranged into second conductive structure arrays, the second conductive structure arrays are disposed next to four sides of the die and is disposed between the first conductive structure arrays.

6. The package according to claim 5, wherein two opposite first sides of the die are arranged along a first direction and two opposite second sides of the die are arranged along a second direction perpendicular to the first direction, a cross-section of each elliptical column is parallel to the rear surface of the die and has a long-axis, the long-axis of the cross-section of the elliptical column that is arranged by the first sides is parallel to the second direction, and the long-axis of the cross-section of the elliptical column that is arranged by the second sides is parallel to the first direction.

7. A package-on-package (PoP) structure, comprising:
a first package, comprising:
a die;
a plurality of conductive structures surrounding the die, wherein the plurality of conductive structures comprises elliptical columns; and
a plurality of joint terminals disposed on top surfaces of the elliptical columns, wherein the plurality of joint terminals comprises ellipsoids, and a long-axis of each of the ellipsoid is parallel to a long-axis of the top surface of the corresponding elliptical column; and a second package on the first package, wherein the second package is electrically connected to the first package through the plurality of joint terminals.

8. The PoP structure according to claim 7, wherein the plurality of conductive structures encircles the die in a radial manner.

9. The PoP structure according to claim 7, wherein a ratio of the long-axis of the top surface of the elliptical column to a short-axis of the top surface of the elliptical column is greater than 1 and less than 8.

10. The PoP structure according to claim 7, wherein a ratio of a short-axis of the ellipsoid to the long-axis of the ellipsoid ranges between 0.3 and 0.9 or between 1.1 and 3.

11. The PoP structure according to claim 7, wherein two opposite first sides of the die are arranged along a first direction and another two opposite second sides of the die are arranged along a second direction perpendicular to the first direction, and the long-axis of the top surface of the elliptical column forms an included angle of 0° to 90° with the first direction.

12. The PoP structure according to claim 11, wherein the long-axis of the ellipsoid forms an included angle of 0° to 90° with the first direction.

13. The PoP structure according to claim 7, wherein two opposite first sides of the die are arranged along a first direction and another two opposite second sides of the die are arranged along a second direction perpendicular to the first direction, the plurality of joint terminals are arranged into first joint terminal arrays, second joint terminal arrays, and third joint terminal arrays, the third joint terminal arrays are disposed by the first sides of the die, the second joint terminal arrays are disposed by the second sides of the die, the second joint terminal arrays and the third joint terminal arrays are located between the first joint terminal arrays.

14. The PoP structure according to claim 13, a first included angle between the first direction and the long-axis of each ellipsoid of the first joint terminal arrays is larger than a second included angle between the first direction and the long-axis of each ellipsoid of the second joint terminals arrays, a third included angle between the second direction and the long-axis of each ellipsoid of the first joint terminal arrays is larger than fourth included angle between the second direction and the long-axis of ach ellipsoid of the third joint terminals arrays.

15. The PoP structure according to claim 14, wherein the first included angle ranges between 0° and 80°, the second included angle ranges between 0° and 45°, the third included angle ranges between 0° and 80°, and the fourth included angle ranges between 0° and 45°.

16. The PoP structure according to claim 7, wherein two opposite first sides of the die are arranged along a first direction and two opposite second sides of the die are arranged along a second direction perpendicular to the first direction, the long-axis of the top surface of the elliptical column that is arranged by the first sides is parallel to the second direction, and the long-axis of the top surface of the elliptical column that is arranged by the second sides is parallel to the first direction.

17. The PoP structure according to claim 16, wherein the long-axis of the ellipsoid that is arranged by the first sides is parallel to the second direction, and the long-axis of the ellipsoid that is arranged by the second sides is parallel to the first direction.

18. A package-on-package (PoP) structure, comprising:
a first package, comprising:
a die, having a rear surface;
a plurality of conductive structures surrounding the die, wherein the plurality of conductive structures comprises elliptical columns; and
a plurality of joint terminals disposed on top surfaces of the elliptical columns, wherein the plurality of joint terminals comprises ellipsoids, each of the ellipsoids has a cross-section parallel to the rear surface of the die, and the cross-section of each of the ellipsoid is concentric with the top surface of the corresponding elliptical column; and
a second package disposed on the first package.

19. The PoP structure according to claim 18, wherein the plurality of conductive structures encircles the die in a radial manner.

20. The PoP structure according to claim 18, wherein an area of the cross-section of each of the ellipsoid is smaller than an area of the top surface of the corresponding elliptical column.

* * * * *